(12) United States Patent
Tatomir et al.

(10) Patent No.: US 9,997,820 B2
(45) Date of Patent: *Jun. 12, 2018

(54) ENHANCED HYBRID-TEE COUPLER

(71) Applicant: THE BOEING COMPANY, Chicago, IL (US)

(72) Inventors: Paul J. Tatomir, Fallbrook, CA (US); James M. Barker, Torrance, CA (US)

(73) Assignee: The Boeing Company, Chicago, IL (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/187,682

(22) Filed: Jun. 20, 2016

(65) Prior Publication Data

US 2017/0117605 A1    Apr. 27, 2017

Related U.S. Application Data

(63) Continuation of application No. 14/313,400, filed on Jun. 24, 2014, now Pat. No. 9,373,880.

(51) Int. Cl.
| | |
|---|---|
| *H01P 5/20* | (2006.01) |
| *H01P 3/12* | (2006.01) |
| *H03H 7/38* | (2006.01) |
| *H01P 5/08* | (2006.01) |

(52) U.S. Cl.
CPC ............ *H01P 5/20* (2013.01); *H01P 3/12* (2013.01); *H01P 5/082* (2013.01); *H03H 7/38* (2013.01)

(58) Field of Classification Search
CPC ............... H01P 5/20; H01P 5/12; H01P 3/12

USPC ................................. 333/122, 125
See application file for complete search history.

(56) References Cited

U.S. PATENT DOCUMENTS

| | | | | |
|---|---|---|---|---|
| 2,584,162 | A * | 2/1952 | Sensiper | H01P 5/20 333/122 |
| 3,657,668 | A * | 4/1972 | Craven | H01P 5/20 333/122 |
| 4,413,242 | A * | 11/1983 | Reeves | H01P 5/20 333/122 |
| 5,614,874 | A * | 3/1997 | McCandless | G01S 13/4409 333/122 |
| 6,600,387 | B2 * | 7/2003 | Cook | H01P 1/2131 333/126 |
| 7,019,603 | B2 * | 3/2006 | Yoneda | H01P 11/002 333/122 |

(Continued)

*Primary Examiner* — Dean Takaoka
(74) *Attorney, Agent, or Firm* — Apogee Law Group P.C.; Francico A. Rubio-Campos

(57) ABSTRACT

An enhanced hybrid-tee coupler ("EHT-coupler"), the EHT-coupler is described. The EHT-coupler includes a first waveguide, second waveguide, third waveguide, and fourth waveguide. The first waveguide defines a first port and the second waveguide defines a second port. Similarly, the third waveguide defines a fourth port and the fourth waveguide defines a fourth port. The first, second, third, and fourth waveguides meet in a single common junction and the first waveguide and second waveguide are collinear. The third waveguide forms an E-plane junction with both the first waveguide and the second waveguide and the fourth waveguide forms an H-plane junction with both the first waveguide and the second waveguide. The EHT-coupler also includes a first impedance matching element positioned in the common junction where the first impedance matching element includes a base and a tip.

18 Claims, 21 Drawing Sheets

(56) References Cited

U.S. PATENT DOCUMENTS

| | | | |
|---|---|---|---|
| 7,397,323 B2* | 7/2008 | Tavassoli Hozouri | H01P 1/161 333/117 |
| 9,373,880 B2* | 6/2016 | Tatomir | H01P 5/20 |
| 2013/0314172 A1* | 11/2013 | Massman | H01P 5/20 333/122 |

* cited by examiner

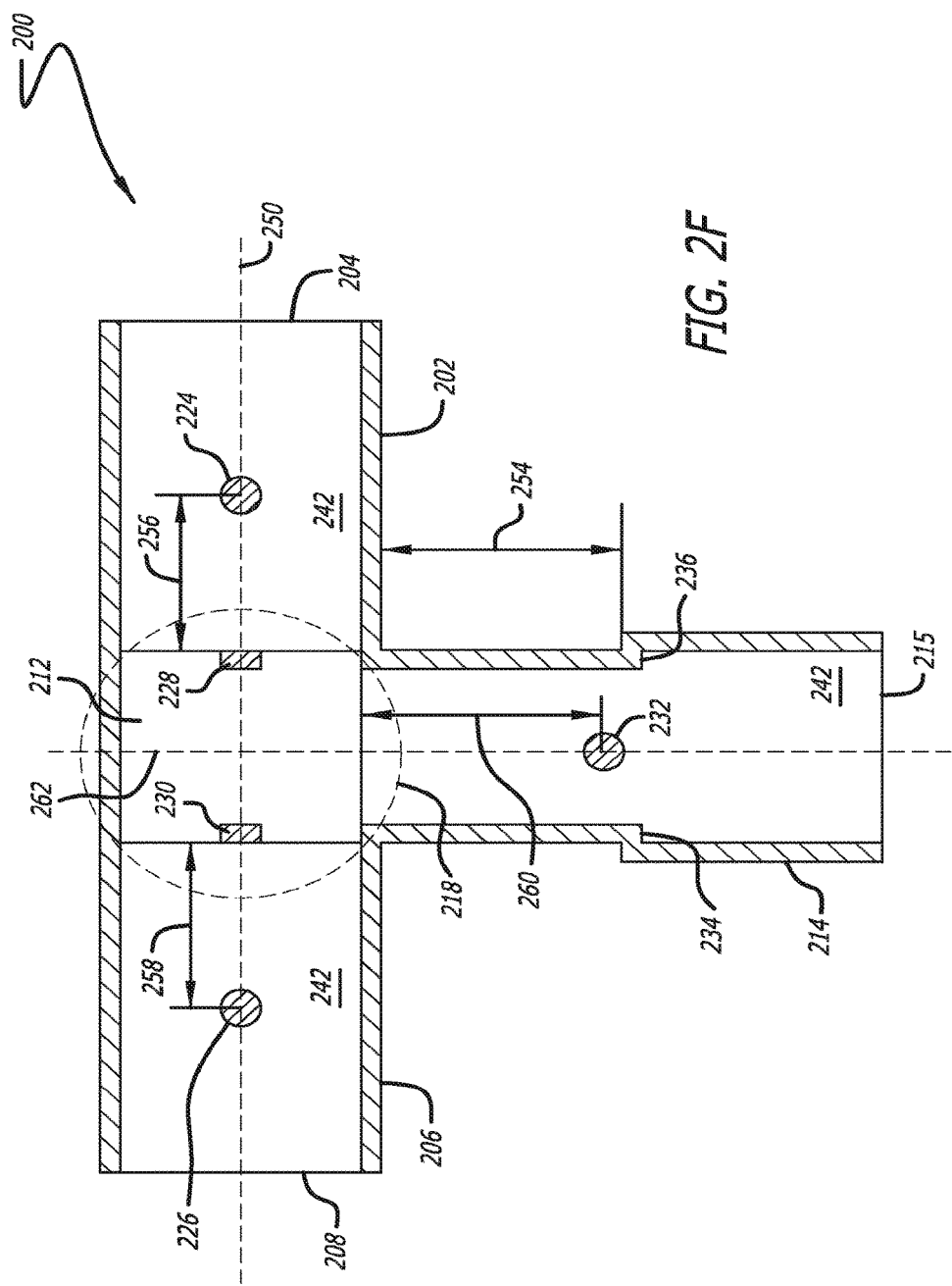

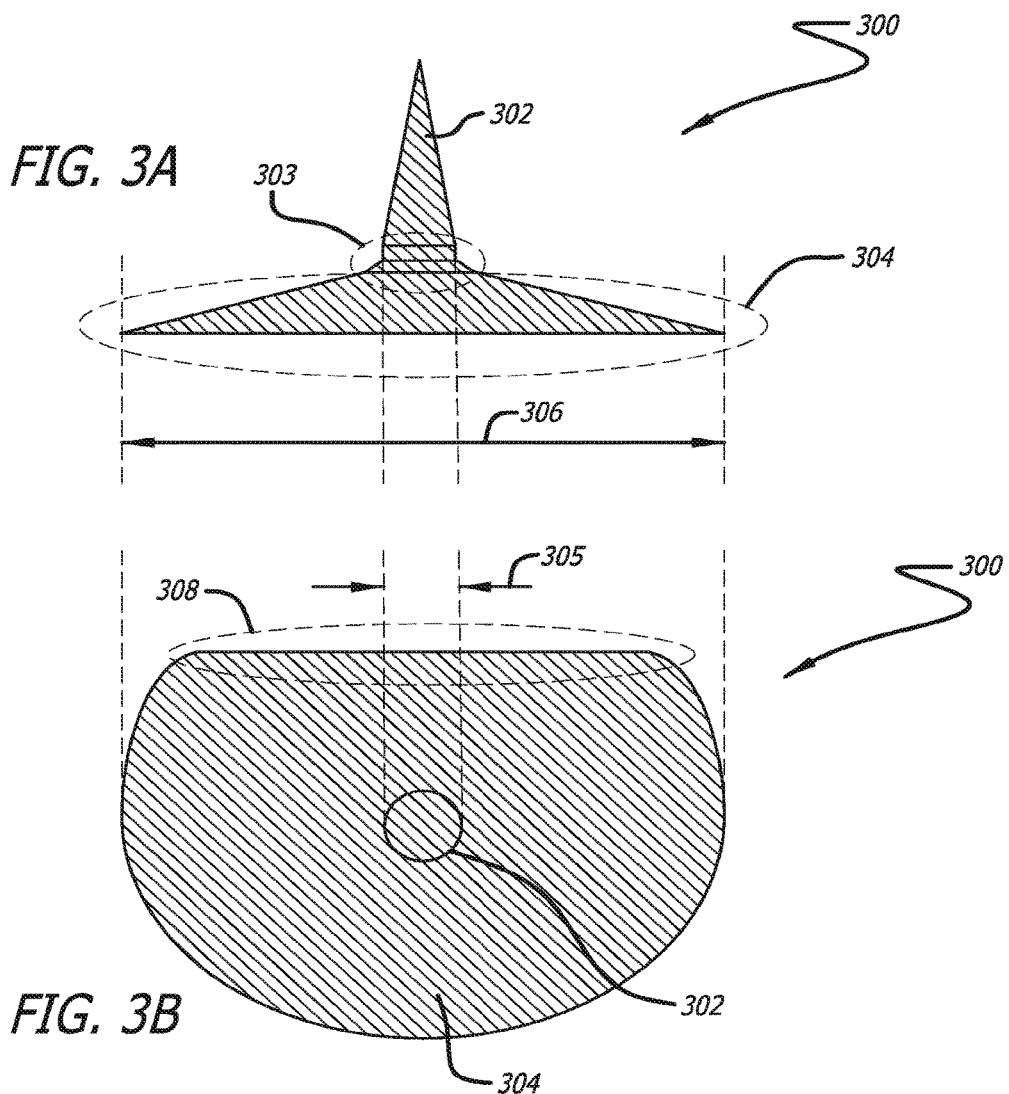

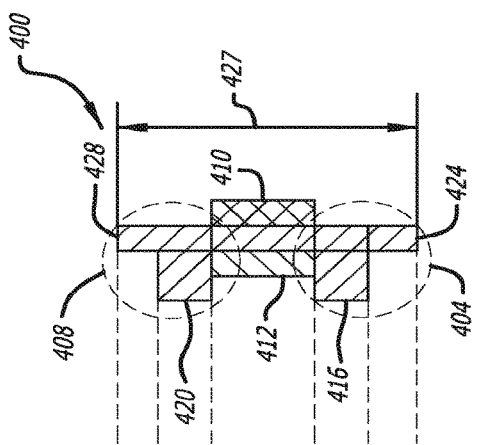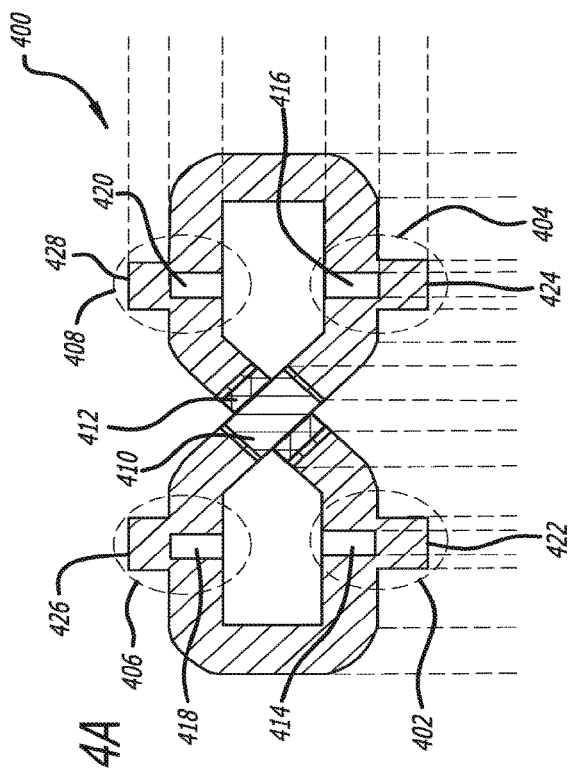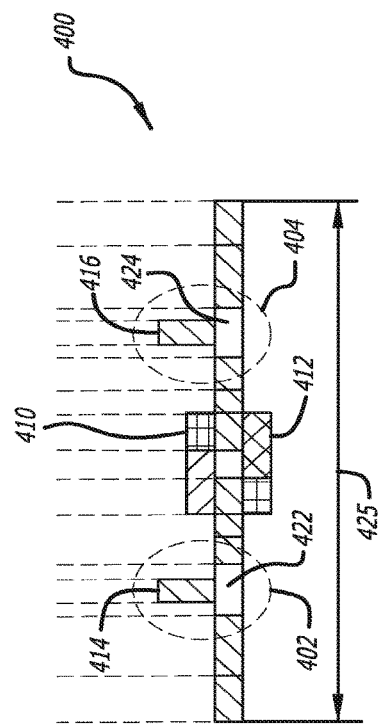

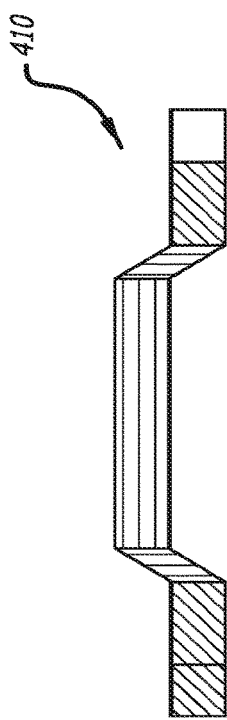
FIG. 4D
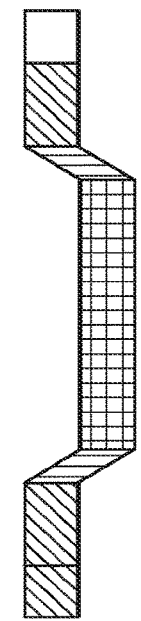
FIG. 4E
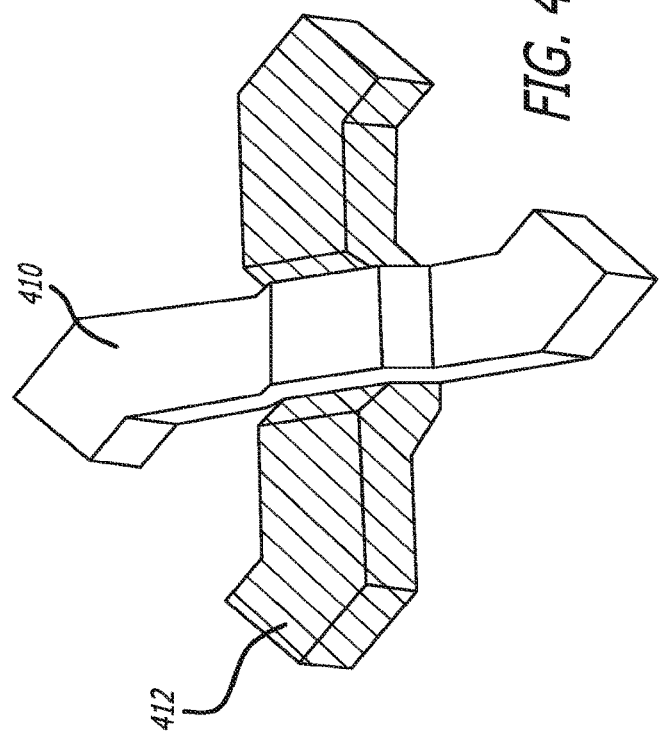
FIG. 4F

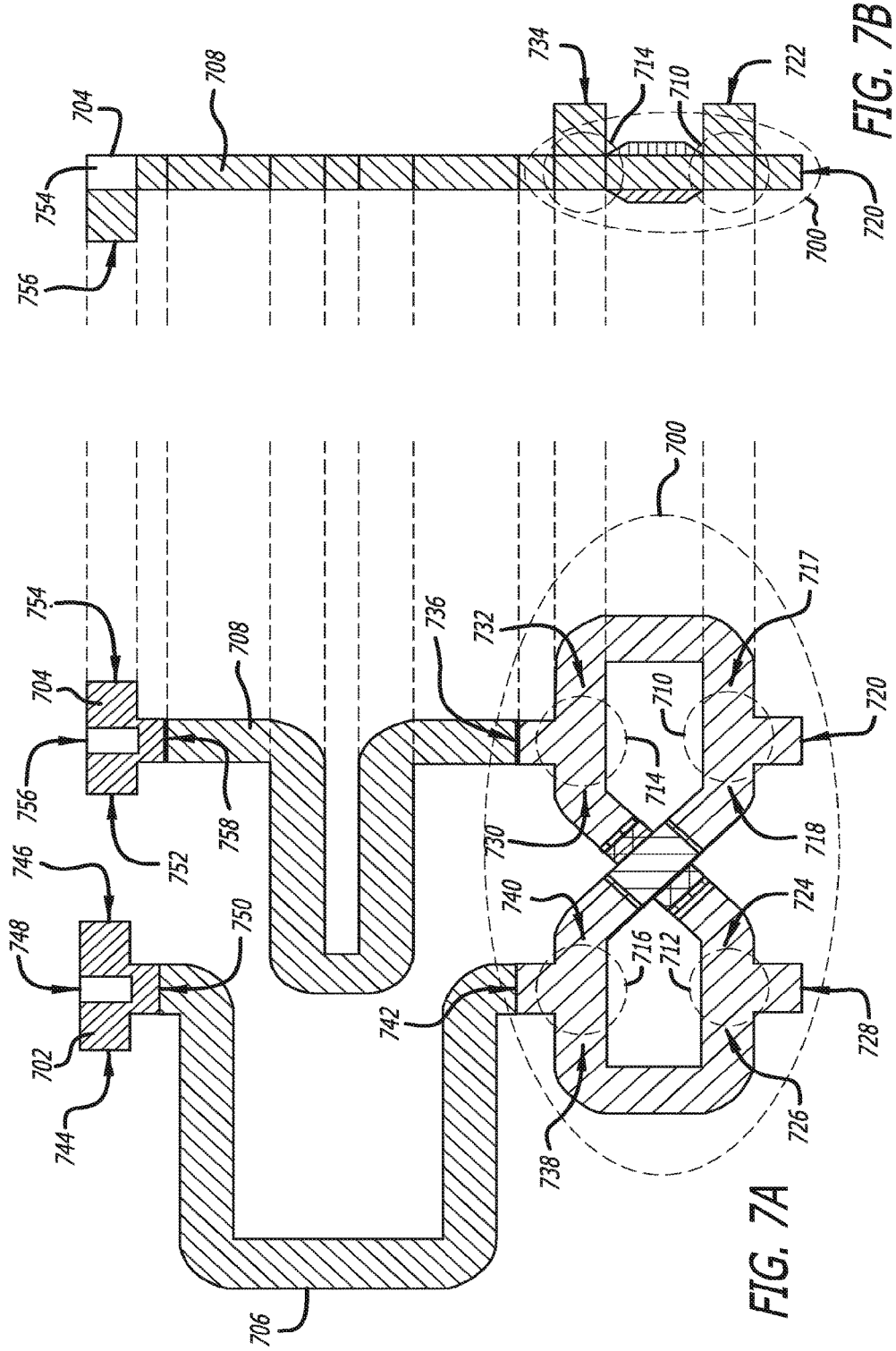

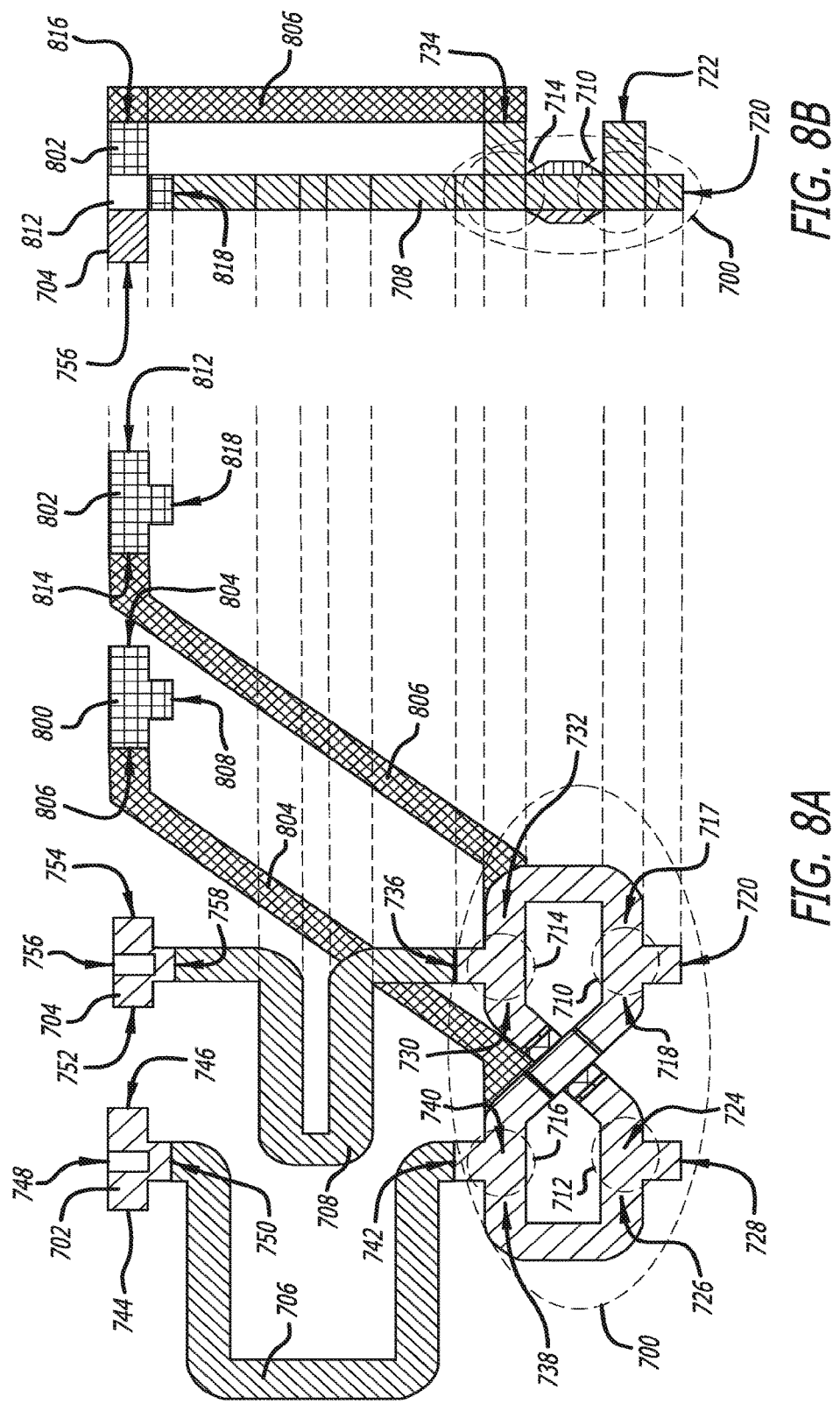

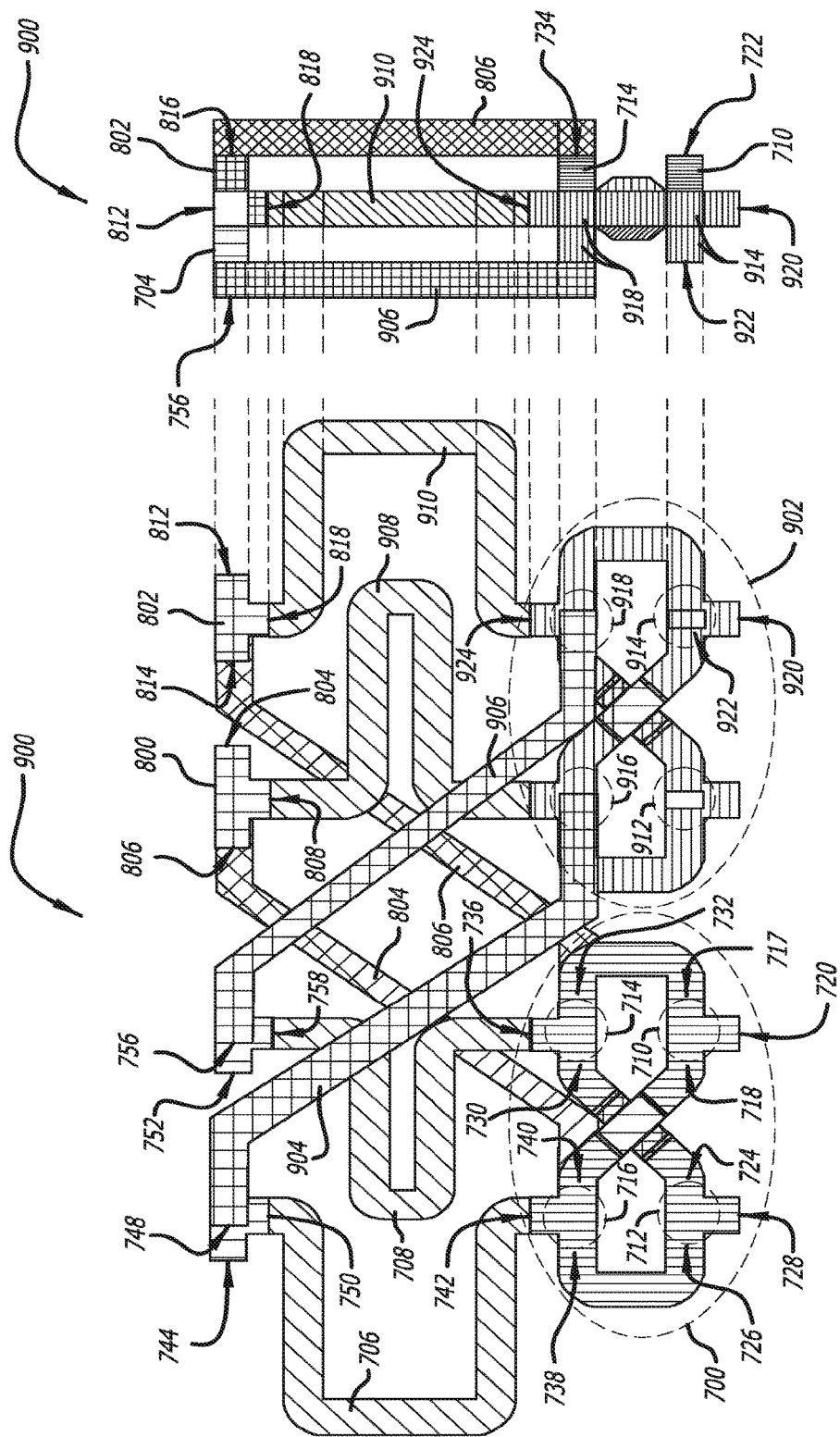

ENHANCED HYBRID-TEE COUPLER

CROSS-REFERENCE TO RELATED APPLICATIONS

This application is a continuation application of U.S. patent application Ser. No. 14/313,400, titled "Enhanced Hybrid-Tee Coupler," filed on Jun. 24, 2014, to inventors Paul J. Tatomir and James M. Barker, which is herein incorporated by reference in its entirety. This application is related to U.S. patent application Ser. No. 14/313,301, titled "Power Division And Recombination Network With Internal Signal Adjustment," filed on the same day, Jun. 24, 2014, to inventors Paul J. Tatomir and James M. Barker, which is herein incorporated by reference in its entirety.

BACKGROUND OF THE INVENTION

1. Field of the Invention

The present invention relates generally to satellite communication systems, and more generally to hybrid-tee couplers utilized in satellite communication systems.

2. Related Art

In today's modern society satellite communication systems have become common place. There are now numerous types of communication satellites in various orbits around the Earth transmitting and receiving huge amounts of information. Telecommunication satellites are utilized for microwave radio relay and mobile applications, such as, for example, communications to ships, vehicles, airplanes, personal mobile terminals, Internet data communication, television, and radio broadcasting. As a further example, with regard to Internet data communications, there is also a growing demand for in-flight Wi-Fi® Internet connectivity on transcontinental and domestic flights. Unfortunately, because of these applications, there is an ever increasing need for the utilization of more communication satellites and the increase of bandwidth capacity of each of these communication satellites. Additionally, typical satellite beam service regions and applied levels are fixed on satellites and providers cannot generally make changes to them once a satellite is procured and placed in orbit.

Known approaches to increase bandwidth capacity utilize high level frequency re-use and/or spot beam technology which enables the frequency re-use across multiple narrowly focused spot beams. However, these approaches typically utilize input and output hybrid matrix networks which generally require very wide bandwidth hybrid elements within the hybrid matrix networks. This also usually includes a need for greater power amplification and handling within these hybrid matrix networks. Unfortunately, known hybrid elements generally result in variable and unconstrained phase splits across the ports of the hybrid matrix network that require special treatment in order to phase correctly within a matrix amplifier associated with the hybrid matrix network. Specifically, known hybrid elements such as hybrid couplers are typically limited bandwidth devices that do not operate well at very wide bandwidths.

Specifically in FIG. 1, a top perspective view of a known hybrid coupler 100 is shown. It is appreciated by those of ordinary skill in the art that the hybrid coupler 100 is generally referred to as a "magic-T" coupler (also known as a "Hybrid-T junction," "Hybrid-Tee coupler," or "Magic Tee coupler"). The hybrid coupler 100 includes a first waveguide 102 defining a first port 104, a second waveguide 106 defining a second port 108, a third waveguide 110 defining a third port 112, and a fourth waveguide 114 defining a fourth port 114. In general, the first waveguide 102 and second waveguide 106 are collinear and the first 102, second 106, third 110, and fourth 114 waveguides meet in a single common junction 118. The hybrid coupler 100 is a combination of an electric ("E") and magnetic ("H") "tees" where the third waveguide 110 forms an E-plane junction with both the first waveguide 102 and the second waveguide 106 and the fourth waveguide 114 forms an H-plane junction with both the first waveguide 102 and the second waveguide 106. It is appreciated that the first 102 and second 106 waveguides are called "side" or "collinear" arms of the hybrid coupler 100. The third port 112 is also known as the H-plane port, summation port (also shown as Σ-port), or parallel port and the fourth port 116 is also known as the E-plane port, difference port (also shown as Δ-port), or series port.

The hybrid coupler 100 is known as a "magic tee" because of the way in which power is divided among the various ports 104, 108, 112, and 116. If E-plane and H-plane ports 112 and 116, respectively, are simultaneously matched, then by symmetry, reciprocity, and conservation of energy the two collinear ports (104 and 108) are matched, and are "magically" isolated from each other.

In an example of operation, an input signal 120 into the first port 104 produces output signals 122 and 124 at the third 112 (i.e., E-plane port) and fourth 116 ports (i.e., H-plane port), respectively. Similarly, an input signal 126 into the second port 108 also produces output signals 122 and 124 at the third 112 and fourth 116 ports, respectively, (but unlike the output signal 124) where the polarity of the resulting output signal 122 corresponding to the input signal 126 at the second port 108 is of an opposite phase (i.e., 180 degrees out of phase) with respect to the polarity of the resulting output signal 124 corresponding to the input signal 120 at the first port 108. As such, if both the input signals 120 and 126 are feed into the first 104 and second 108 ports, respectively, the output signal 124 at the fourth port 116 is a combination (i.e., a summation) of the two individual output signals corresponding to each input signal 120 and 126 at the first 104 and second 108 ports and the output signal 122 at the third port 112 is a combined signal that is equal to the difference of the two individual output signals corresponding to each input signal 120 and 126 at the first 104 and second 108 ports.

An input signal 128 into the third port 112 produces output signals 130 and 132 at the first 104 and second 108 ports, respectively, where both output signals 130 and 132 are of opposite phase (i.e., 180 degrees out of phase from each other). Similarly, an input signal 134 into the fourth port 116 also produces output signals 130 and 132 at the first 104 and second 108 ports, respectively; however, the output signals 130 and 132 are in phase. The resulting full scattering matrix for an ideal magic tee (where all the individual reflection coefficients have be adjusted to zero) is then $$S = \frac{1}{\sqrt{2}} \begin{bmatrix} 0 & 0 & 1 & 1 \\ 0 & 0 & -1 & 1 \\ 1 & -1 & 0 & 0 \\ 1 & 1 & 0 & 0 \end{bmatrix}.$$

Unfortunately, this hybrid coupler 100 is assumed to be an ideal magic tee that does not exist in the reality. To function correctly, the hybrid coupler 100 must incorporate some type of internal matching structure (not shown) such as a post (not shown) inside the H-plane tee (i.e., fourth port 116) and possibly an inductive iris (not shown) inside the E-plane (i.e., third port 112). Because of the need to some type of internal matching structure inside the hybrid coupler 100, which is inherently frequency dependent, the resulting hybrid coupler 100 with an internal matching structure will only operate properly over a limited frequency bandwidth (i.e., over a narrow bandwidth).

Therefore, there is a need for an improved hybrid matrix network and corresponding hybrid element that addresses these problems.

SUMMARY

An enhanced hybrid-tee coupler ("EHT-coupler"), the EHT-coupler is described. The EHT-coupler includes a first waveguide, second waveguide, third waveguide, and fourth waveguide. The first waveguide defines a first port and the second waveguide defines a second port. Similarly, the third waveguide defines a fourth port and the fourth waveguide defines a fourth port. The first, second, third, and fourth waveguides meet in a single common junction and the first waveguide and second waveguide are collinear. The third waveguide forms an E-plane junction with both the first waveguide and the second waveguide and the fourth waveguide forms an H-plane junction with both the first waveguide and the second waveguide.

The EHT-coupler also includes a first impedance matching element positioned in the common junction. The first impedance matching element includes a base and a tip. The base of the first impedance matching element is located at a coplanar common waveguide wall of the first waveguide, second waveguide, and third waveguide and the tip of the first impedance matching element extends outward from the base of the first impedance matching element directed towards the fourth waveguide.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

FIG. 2F is a bottom view cut along plane C-C' showing the second, third, fourth, fifth, six, seventh, and eighth impedance matching elements in accordance with the present invention.

FIG. 3A is a side-view of an example of an implementation of the first impedance matching element shown in FIGS. 2A through 2E in accordance with the present invention.

FIG. 3B is a top view of the first impedance matching element shown in FIG. 3A in accordance with the present invention.

FIG. 4A is a top view of an example of an implementation of a 4-by-4 matrix waveguide network ("4×4 MWN") having four EHT-couplers in accordance with the present invention.

FIG. 4B is a front view of the 4×4 MWN shown in FIG. 4A in accordance with the present invention.

FIG. 4C is a side-view of the 4×4 MWN shown in FIGS. 4A and 4B in accordance with the present invention.

FIG. 4D is a side-view of an example of an implementation of a first bridge of the 4×4 MWM shown in FIG. 4A in accordance with the present invention.

FIG. 4E is a side-view of an example of an implementation of a second bridge of the 4×4 MWM shown in FIG. 4A in accordance with the present invention.

FIG. 4F is a prospective top-view of an example of an implementation of first bridge and second bridge of the 4×4 MWN (shown in FIGS. 4A, 4B, 4C, 4D and 4E) in accordance with the present invention.

FIG. 7A is a top view of the 4×4 MWN shown in FIG. 5 in signal communication with a fifth and sixth EHT-couplers via a first signal path and a second path, respectively, in accordance with the present invention.

FIG. 7B is a top view of the 4×4 MWN shown in FIG. 7A in accordance with the present invention.

FIG. 8A is a top view of the 4×4 MWN, shown in FIG. 7, in signal communication with a seventh and eighth EHT-coupler via a third and fourth signal paths, respectively, in accordance with the present invention.

FIG. 8B is a side-view of the 4×4 MWN, shown in FIG. 8A, in signal communication with the seventh and eighth EHT-coupler via the third and fourth signal paths, respectively, in accordance with the present invention.

FIG. 9A is a top view of an example of an implementation of a power division and recombination network with internal signal adjustment ("PDRN") utilizing an 8-by-8 hybrid matrix waveguide network ("8×8 MWN") that utilizes the 4×4 MWN shown in FIGS. 8A and 8B in accordance with the present invention.

FIG. 9B is a side-view of the 8×8 MWN shown if FIG. 9A.

DETAILED DESCRIPTION

An enhanced hybrid-tee coupler ("EHT-coupler"), the EHT-coupler is described. The EHT-coupler includes a first waveguide, second waveguide, third waveguide, and fourth waveguide. The first waveguide defines a first port and the second waveguide defines a second port. Similarly, the third waveguide defines a fourth port and the fourth waveguide defines a fourth port. The first, second, third, and fourth waveguides meet in a single common junction and the first waveguide and second waveguide are collinear. The third waveguide forms an E-plane junction with both the first waveguide and the second waveguide and the fourth waveguide forms an H-plane junction with both the first waveguide and the second waveguide.

The EHT-coupler also includes a first impedance matching element positioned in the common junction. The first impedance matching element includes a base and a tip. The base of the first impedance matching element is located at a coplanar common waveguide wall of the first waveguide, second waveguide, and third waveguide and the tip of the first impedance matching element extends outward from the base of the first impedance matching element directed towards the fourth waveguide.

Figure 1:
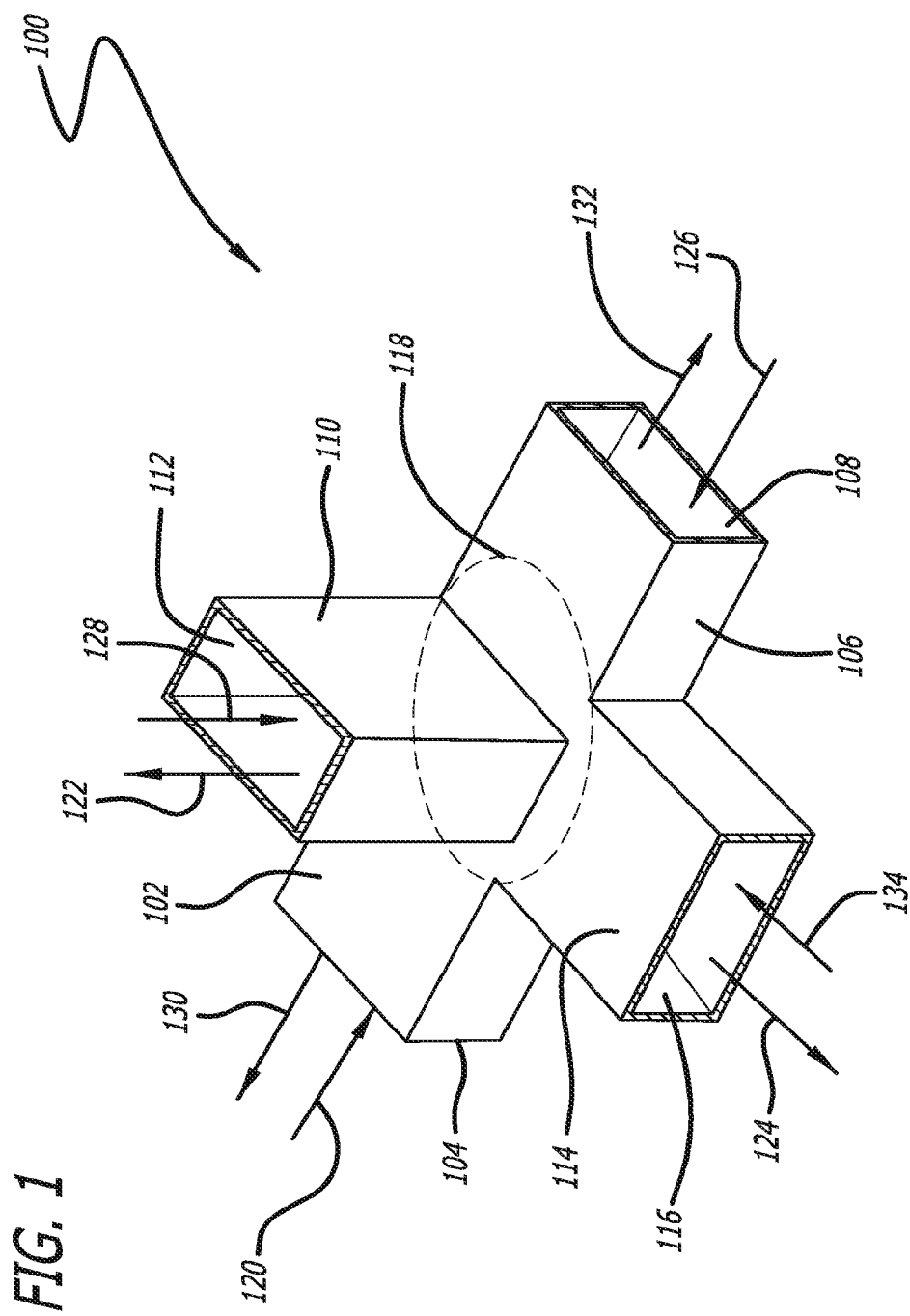
FIG. 1 is a top perspective view of a known hybrid coupler.
Figure 2A:
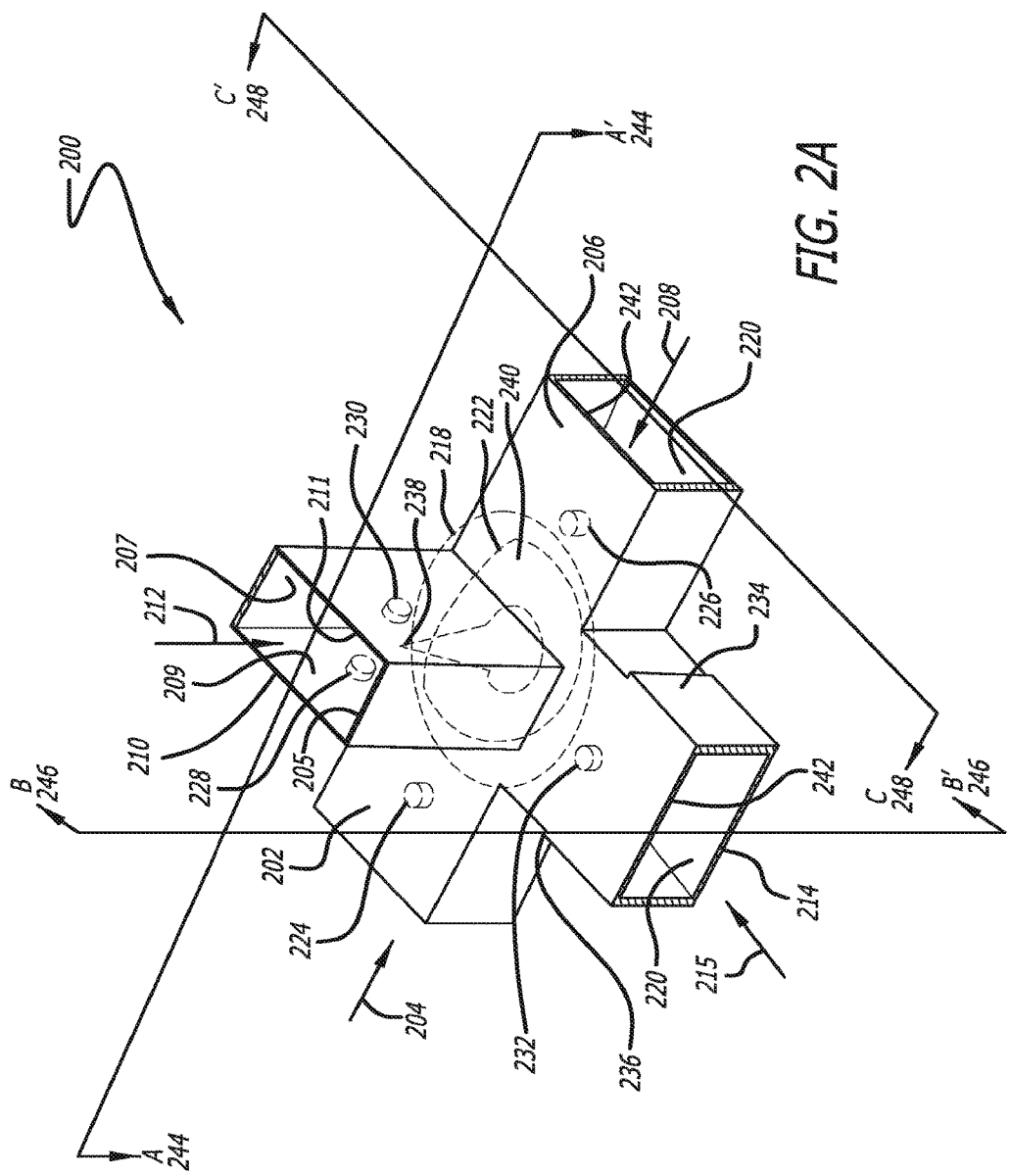
FIG. 2A is a top perspective view of an example of an implementation of an enhanced hybrid-tee coupler ("EHT-coupler") in accordance with the present invention.

Turning to FIG. 2A, a top perspective view of an example of an implementation of an EHT-coupler 200 is shown in accordance with the present invention. The EHT-coupler 200 includes a first waveguide 202 defining a first port 204, a second waveguide 206 defining a second port 208, a third waveguide 210 defining a third port 212, and a fourth waveguide 214 defining a fourth port 215. In general, the first waveguide 202 and second waveguide 206 are collinear and the first 202, second 206, third 210, and fourth 214 waveguides meet in a single common junction 218. Similar to the hybrid coupler 100 of FIG. 1, the EHT-coupler 200 is a combination of an electric ("E") and magnetic ("H") junctions (referred to as "tees") where the third waveguide 210 forms an E-plane junction with both the first waveguide 202 and the second waveguide 206 and the fourth waveguide 214 forms an H-plane junction with both the first waveguide 202 and the second waveguide 206. Again, it is appreciated that the first 202 and second 206 waveguides are known as "side" or "collinear" arms of the EHT-coupler 200. The fourth port 215 is also known as the H-plane port, summation port (also shown as Σ-port), or parallel port and the third port 212 is also known as the E-plane port, difference port (also shown as Δ-port), or series port. In this example, the common waveguide broad wall of the first, second, and fourth waveguides 202, 206, and 214, respectively, define a coplanar common waveguide wall 220. The third waveguide 210 includes a front narrow wall 205, back narrow wall 207, front broad wall 209, and back broad wall 211.

Unlike the hybrid coupler 100 of FIG. 1, the EHT-coupler 200 may also include a first impedance matching element 222, a second impedance matching element 224, third impedance matching element 226, fourth impedance matching element 228, fifth impedance matching element 230, sixth impedance matching element 232, seventh impedance matching element 234, and eighth impedance matching element 236. The first impedance matching element 222 may include a tip 238 and a base 240, where the tip 238 may be cone shaped and the base 240 may be gradual three-dimensional transitional shaped object that gradually transitions the physical geometry of the first impedance matching element 222 from the coplanar common waveguide wall 220 to the cone shaped tip 238. Optionally, the base 240 may also be a conical shaped structure that allows the first impedance matching element 222 to transition for a flatter and broader conical structure at the base 240 to a sharper taller and narrower conical structure at the tip 238. Additionally, instead of a conic structure, such as a cone, the first impedance matching element 222, tip 238, and/or base 240 may also be a pyramid structure of other similar structural shape that is wider at the base 240 and sharper at the end of the tip 238. Moreover, the first impedance matching element 222 may be a single continuous conical, pyramid, or other similar structural shape that is wider at the base 240 and sharper at the end of the tip 238, where the base 240 is portion of the first impedance matching element 222 that makes contact with the coplanar common waveguide wall 220. In these examples, the first impedance matching element 222 extends outward from base 240 at the coplanar common waveguide wall 220 and the tip 238 points into the inner cavity volume (also referred to simply as a "cavity") the third waveguide 210.

In general, the second, third, fourth, fifth, and sixth impedance matching elements 224, 226, 228, 230, and 232, respectively, may be each a metal capacitive tuning "post," "button," or "stub." The second, third, and sixth impedance matching elements 224, 226, and 232 may extend outward from a common top wall 242 into the cavities of the first waveguide 202, second waveguide 206, and fourth waveguide 214, respectively. The top wall 242 may be a common waveguide broad wall of the first, second, and fourth waveguides 202, 206, and 214, respectively, which is located opposite the coplanar common waveguide wall 220. The fourth and fifth impedance matching elements 228 and 230 may extend outward (i.e., into the inner cavity of the third waveguide 210) from the corresponding opposite waveguide broad walls of the third waveguide 210, where the fourth impedance matching element 228 extends outward from the front broad wall 209 into the cavity of the third waveguide 210 and the fifth impedance matching element 230 extends outward from the back broad wall 211 into the cavity of the third waveguide 210. In this example, the waveguides 202, 206, 210, and 214 may be, for example, X-Ku band waveguides such as WR-75 rectangular waveguides that have inside dimensions of 0.750 inches by 0.375 inches and frequency limits of 10.0 to 15.0 GHz.

As mentioned earlier, the EHT-coupler 200 may be formed of a plurality of waveguides 202, 206, 210, and 214 coming together at the common junction 230. These waveguides 202, 206, 210, and 214 are generally either metallic or metallically plated structures where the types of metals that may be used include any low loss type metals including copper, silver, aluminum, gold, or any metal that has a low bulk resistivity.

The seventh and eighth impedance matching elements 234 and 236 may be discontinuities in the narrow walls of the fourth waveguide 214. As an example, of one or both of these discontinuities would be to reduce the width of the fourth waveguide 214 so act as a waveguide transformer that enables equal phase and delay reference points to exist within the EHT-coupler 200. In this example, both the seventh and eight impedance matching elements 234 and 236 are shown as forming a transformer that narrows the width of the fourth waveguide 214 from a first waveguide width dimension at the fourth port 215 to a second narrower waveguide width dimension at the common junction 218. The transition from the first waveguide width dimension to the second narrower waveguide width dimension is shown happening at the location of the seventh and eighth impedance matching elements 234 and 236. However, it is appreciated that an alternative configuration may the locations of the seventh and eighth impedance matching elements 234 and 236 along the length of the fourth waveguide 214 may be different so as to produce two waveguide transformers. Additionally, it is also appreciated that the waveguide transformer may only include one of the seventh and eighth impedance matching elements 234 and 236 instead of the two shown in FIG. 2A.

In this example, the tip 238 may be cone shaped to ease the electromagnetic fields (not shown) induced in the EHT-coupler 200 to split evenly at the common junction 218. The tip 238 may also be a cone, pyramid or other similar structural shape that is wider at the base 240 and sharper at the end of the tip 238. Again, the base 240 may be a similar structure as described earlier. The second, third, fourth, fifth, and sixth impedance matching elements 224, 226, 228, 230, and 232, respectively, may be capacitive tuning elements that are configured to cancel any reactive parasitic effects at the common junction 218. It is appreciated that the size and placement of the second, third, fourth, fifth, and sixth impedance matching elements 224, 226, 228, 230, and 232 within the EHT-coupler 200 are predetermined based on the design parameters of the EHT-coupler 200, which include, for example, desired frequency of operation, desired isolation between isolated ports, desired internal matching within the EHT-coupler 200, desired loss, etc.

In this example, the first impedance matching element 222 is an example of a means for internally impedance matching the common junction 218 of the EHT-coupler 200. The second impedance matching element 224 is an example of a means for internally impedance matching the first port 204 of the first waveguide 200 and the common junction 218 of the EHT-coupler 200 to the first waveguide 202. The third impedance matching element 226 is an example of a means for internally impedance matching the second port 208 of the second waveguide 206 and the common junction 218 of the EHT-coupler 200 to the second waveguide 206. The fourth impedance matching element 228 and fifth impedance matching element 230 are an example of a means for internally impedance matching the third port 212 of the third waveguide 210 and the common junction 218 of the EHT-coupler 200 to the third waveguide 210. The sixth impedance matching element 232 is an example of a means for internally impedance matching the fourth port 215 of the fourth waveguide 214 and the common junction 218 of the EHT-coupler 200 to the fourth waveguide 215. The seventh and eighth impedance matching elements 234 and 236 form an impedance transformer that is an example of a means for narrowing a first waveguide width of the fourth waveguide 214, at the fourth port 215, to a second narrower waveguide dimension prior to the common junction 218 of the EHT-coupler 200.

In an example of operation, an input signal into the first port 204 only produces a first and second output signals at the third 212 (i.e., E-plane port) and fourth 215 ports (i.e., H-plane port), respectively. Similarly, an input signal into the second port 208 only produces a third and fourth output signals at the third 212 and fourth 215 ports, respectively. In both of the cases, the first port 202 and second port 208 are isolated from each other and, therefore, produce no output signal at each other's port.

Additionally, in both of these cases, the second and fourth output signals produced at the fourth port 215 have the same phase value. If this phase value is set to a reference phase value of zero degrees, the phase values of the first and third output signals produced at the third port 212 will have a phase value of zero for the one of the output signals and a phase value of 180 degrees for the other output signal. If, as an example, the first output signal at the third port 212 (produced by the input signal at the first port 204) has a phase value of zero degrees (when normalized with the phase values of the second and fourth output signals at the fourth port 215), the third output signal at the third port 212 (produced by the input signal at the second port 208) will have a phase value of 180 degrees.

Figure 2B:
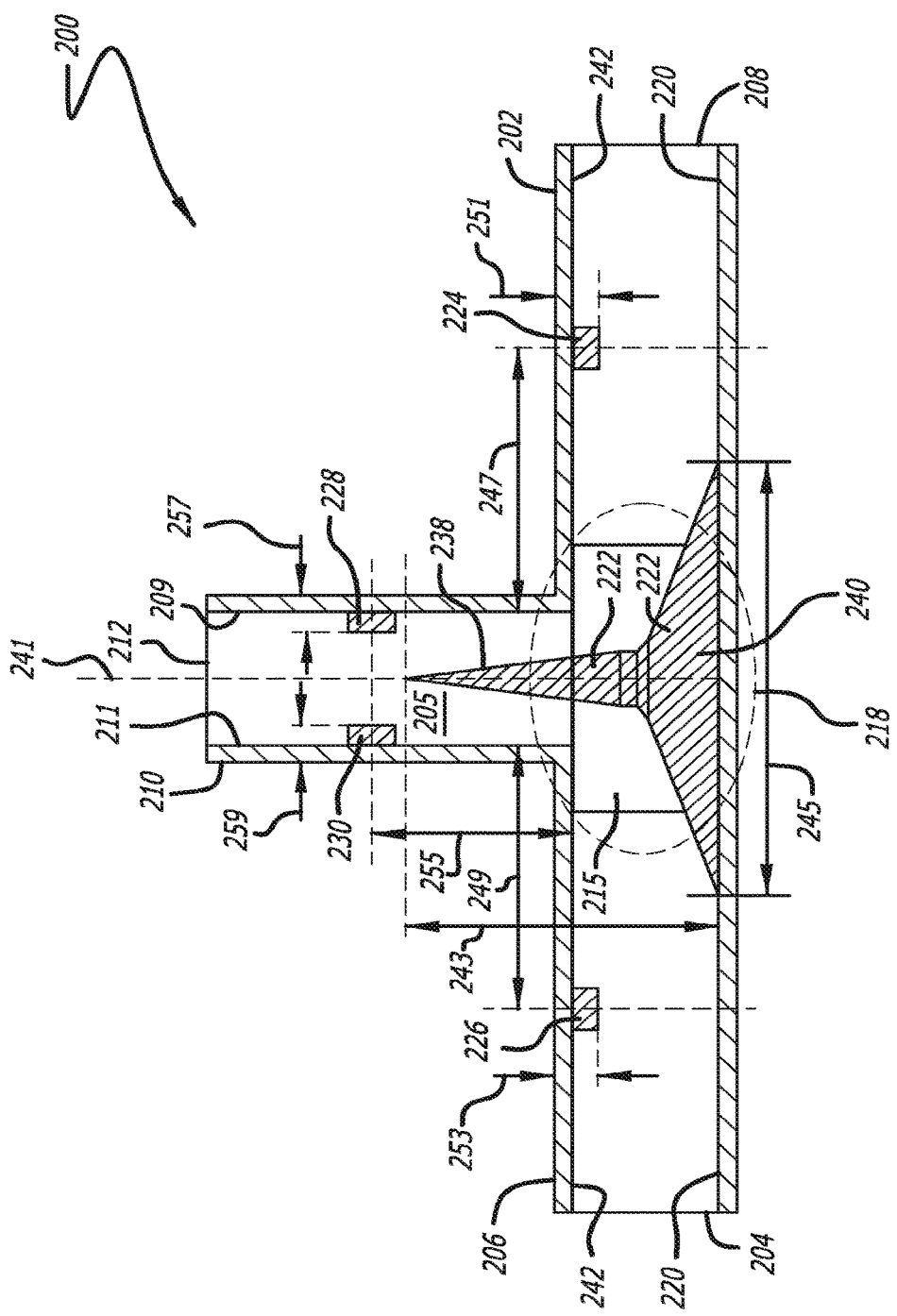
FIG. 2B is a back view cut along plane A-A' showing a first, second, third, fourth, and fifth impedance matching elements shown in FIG. 2A in accordance with the present invention.

In FIG. 2B, a back view cut along plane A-A' 244 showing the first, second, third, fourth, and fifth impedance matching elements 222, 224, and 226, shown in FIG. 2A, is shown in accordance with the present invention. In this example, the tip 238 is shown to be a cone shaped element that protrudes from the base 240 into the third waveguide 210. The first impedance matching element 222 is configured to ease the electric and magnetic fields into splitting evenly at the common junction 218. The second and third impedance matching elements 224 and 226 may be posts, buttons, or caps that protrude from the top wall 242 (into the cavity of the first and second waveguides 202 and 206, respectively) to form capacitive tuning elements that are configured to cancel any reactive parasitic effects at the common junction 218 that would reflect outward into the first and second waveguides 202 and 206, respectively. The fourth and fifth matching elements 228 and 230 may be either capacitive or inductive elements that are configured to cancel any reactive parasitic effects at the common junction 218 that would reflect outward into the third waveguide 210. Based on the position of the fourth and fifth matching elements 228 and 230, they may individually act as capacitive tuning posts, buttons, or caps or together as an inductive iris within the cavity of the third waveguide 210. As an example, the fourth and fifth matching elements 228 and 230 may be aligned alone a centerline 231 (shown in FIGS. 2C and 2D) of the third waveguide 210 and extend outward from the front broad wall 209, and back broad wall 211, respectively, into the cavity of the third waveguide 210.

In this example, first impedance matching element 222 may be approximately 0.655 inches high 243 and approximately 1.14 inches in diameter 245 at the base 240. In this example, the diameter 245 extends out radially from a centerline 241 (of the front and back narrow walls 205 and 207) into the first and second waveguides 202 and 206. In this example, the base 240 may be circular but truncated near the common narrow wall 252 (shown if FIG. 2E) at the back of the common junction 218. The second and third impedance matching elements 224 and 226 may be each located (247 and 249) approximately 0.296 inches away from the broad-wall surfaces (i.e., front broad wall 209, and back broad wall 211, respectively) of the third waveguide 210. Additionally, the second and third impedance matching elements 224 and 226 may be each tuning buttons (or caps or stubs) that have a 0.112 inch diameter and extend (251 and 253) approximately 0.050 from the top wall 242 into the first waveguide 202 and second waveguide 206, respectively. The fourth and fifth impedance matching elements 228 and 230 may be each located 255 approximately 0.396 inches from the top wall 242. Moreover, the fourth and fifth impedance matching elements 228 and 230 may be each tuning buttons (or caps or stubs) that have a 0.112 inch diameter and extend (257 and 259) approximately 0.045 from the broad-walls (i.e., front broad wall 209, and back broad wall 211, respectively) into the third waveguide 210, respectively. Furthermore, as mentioned earlier the second, third, fourth, and fifth impedance matching elements 224, 226, 228, and 230 are located along the centerline 250 (shown if FIG. 2E) of the top wall 242 and the centerline 231 of the front broad wall 209, and back broad wall 211 of the third waveguide 210, respectively.

Figure 2C:
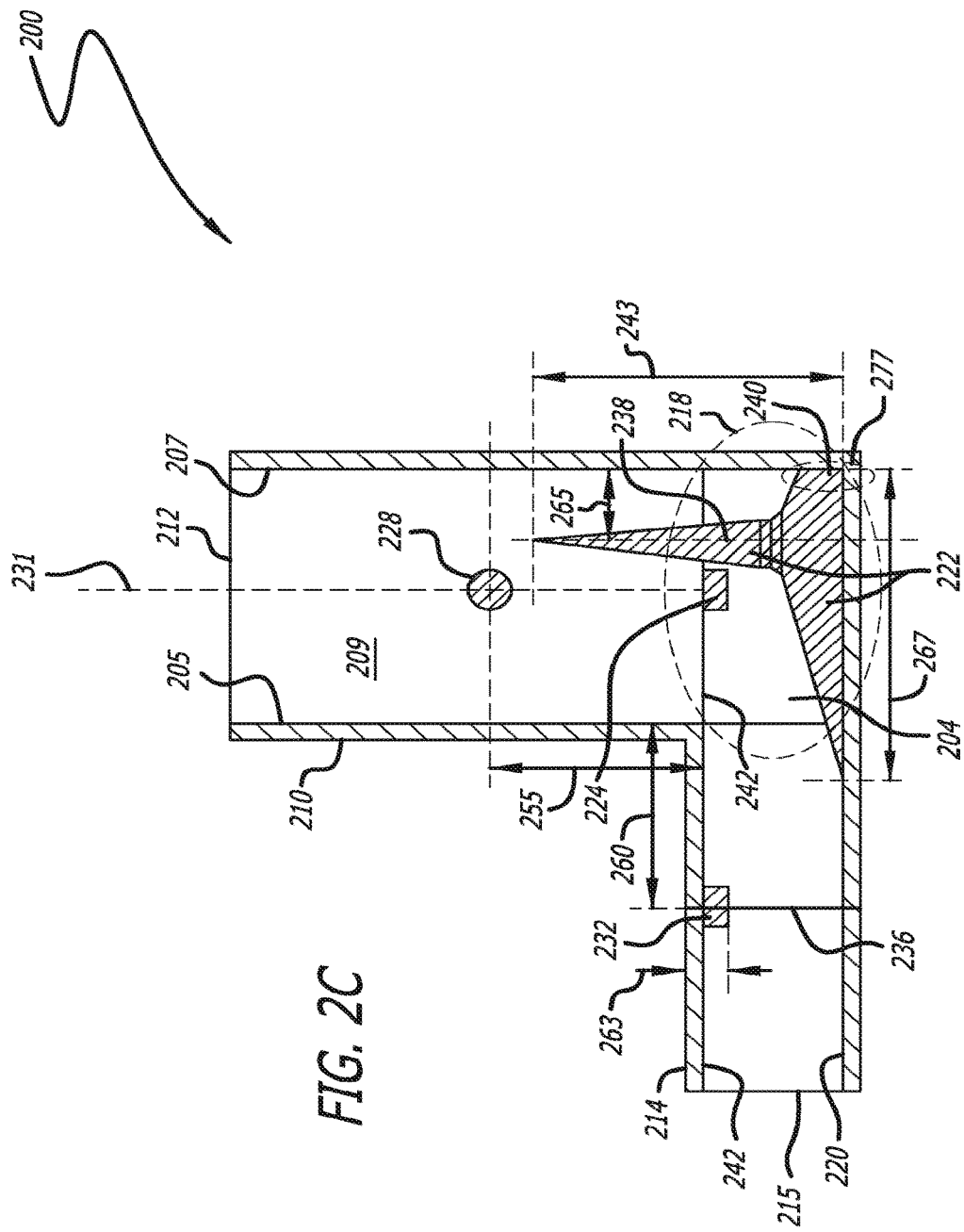
FIG. 2C is a side-view cut along plane B-B' showing the first, second, fourth, sixth, and eighth impedance matching elements shown in FIG. 2A in accordance with the present invention.

In FIG. 2C, a side-view cut along symmetric plane B-B' 246 showing the first, second, fourth, sixth, and eighth impedance matching elements 222, 224, 228, 232, and 236, shown in FIG. 2A, is shown in accordance with the present invention. In this example, the eighth impedance matching element 236 defines a step transformer within the fourth waveguide 214 where width of the fourth waveguide 214 is reduced from a first width at the fourth port 215 to a narrower width after the eighth impedance matching element 236 going into the common junction 218. As an example, the sixth impedance matching element 236 may be located 260 approximately 0.296 inches from the narrow wall of the third waveguide 210, where the sixth impedance matching element 236 is a tuning button having a 0.112 inch diameter that extends 263 approximately 0.07 inches from the top wall 242 into the cavity of the fourth waveguide 214. Additionally, the seventh and eighth impedance matching elements 234 and 236 may also be located 260 approximately 0.296 inches from the narrow wall of the third waveguide 210. In this example, the width of the fourth waveguide 214 may be reduced from 0.750 inches at the fourth port 215 to approximately 0.710 inches from the seventh and eighth impedance matching elements 234 and 236 to the common junction 218 for an approximate length 260 of 0.296 inches. Furthermore, the tip 238 of the first impedance matching element 222 may be located 265 approximately 0.250 inches from the back narrow wall of the third waveguide 210 and the base 240 extends 267 approximately 0.8125 inches from the back narrow wall 207 of the third waveguide 210.

Figure 2D:
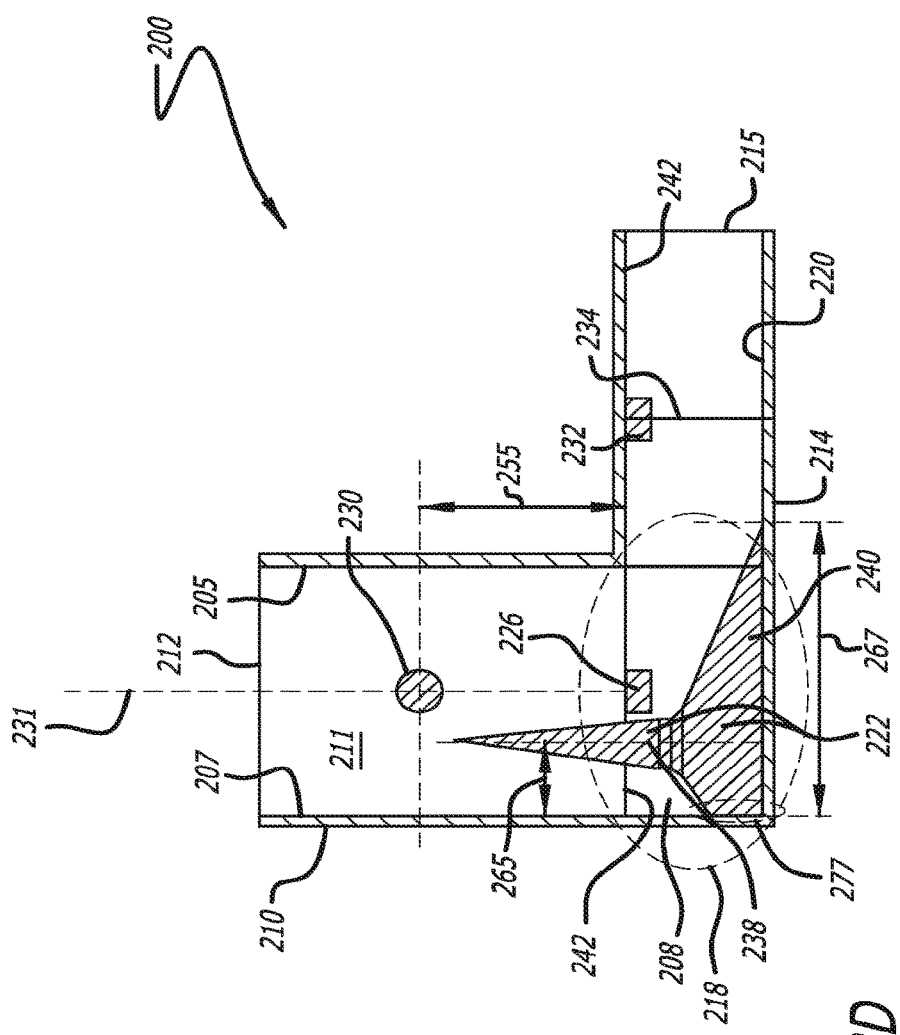
FIG. 2D is a side-view cut along plane B-B' showing the first, third, fifth, sixth, and seventh impedance matching elements shown in FIG. 2A in accordance with the present invention.

Similarly, in FIG. 2D, a side-view cut along symmetric plane B-B' 246 showing the first, third, fifth, sixth, and seventh impedance matching elements 222, 226, 230, 232, and 234 is shown in accordance with the present invention. It is noted that in this example shown in FIGS. 2C and 2D, the diameter 245 of the base 240 is shown truncated 277 along the common narrow wall 252; however, it is appreciated that base 240 may also be a non-truncated approximately circular structure.

Figure 2E:
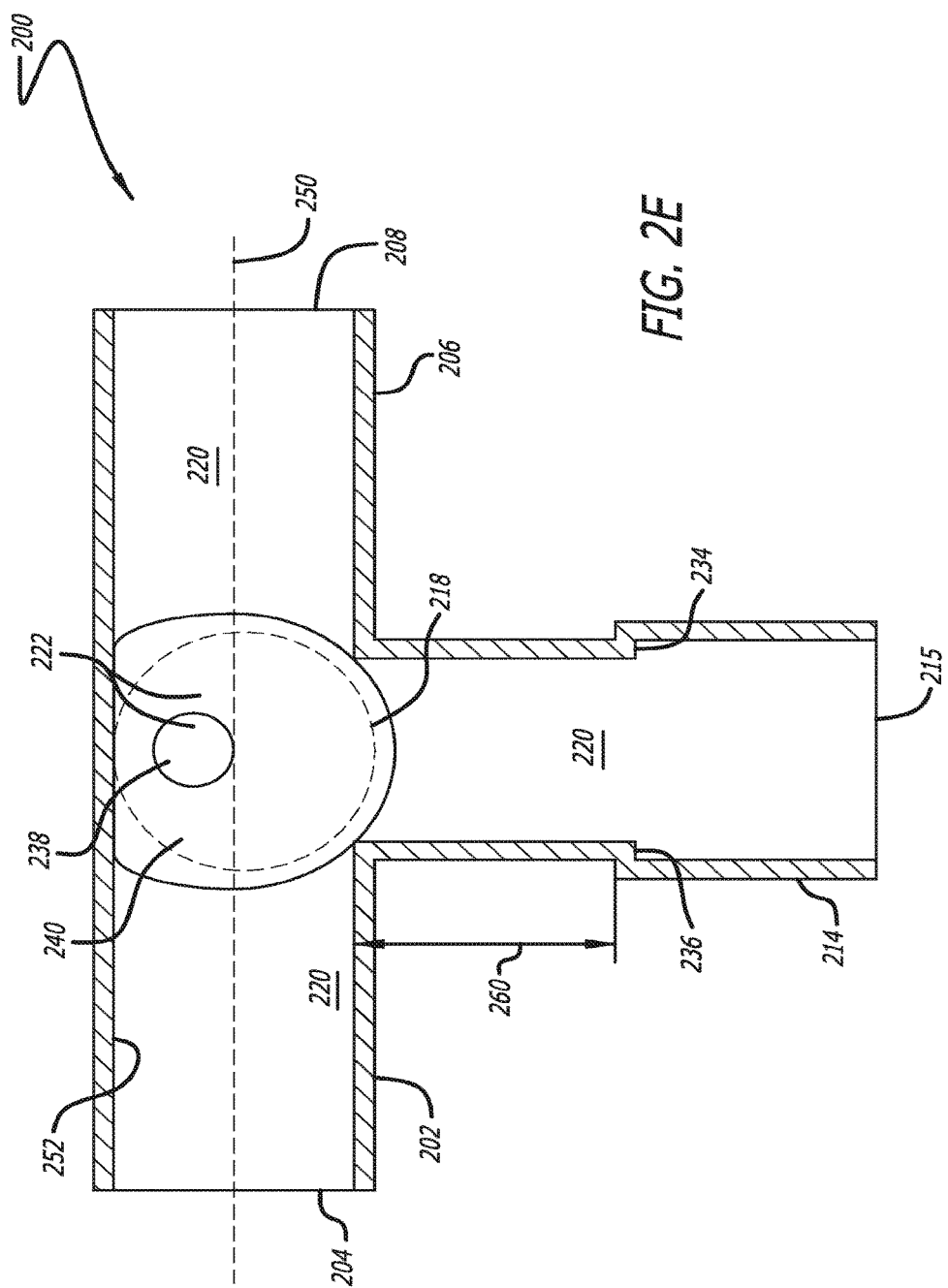
FIG. 2E is a top view cut along plane C-C' showing the first, seventh, and eighth impedance matching elements in accordance with the present invention.

In FIG. 2E, a top view cut along plane C-C' 248 showing the first, seventh, and eighth impedance matching elements 222, 234, and 236 is shown in accordance with the present invention. The coplanar common waveguide wall 220 is shown to be a common lower broad wall of the first, second, and fourth waveguides 202, 206, and 214. Additionally, the base 240 of the first impedance matching element 222 is shown to be elliptical in shape which transitions to the tip 238. The first impedance matching element 222 is located within the common junction 218. The tip 238 may be optionally located either centered to the base 240 or offset to one side of the base based on the predetermined design parameters of the EHT-coupler. In FIG. 2E, the tip 238 is shown as being offset from the centerline 250 of the first and second waveguides 202 and 206 in such a way to be closer to the common narrow wall 252; however, it is appreciated that this is for example purpose only and the tip 238 may be optionally located on the centerline 252 of the first and second waveguides 202 and 206 within the common junction 218.

In this example, the seventh and eighth impedance matching elements 234 and 236 are shown to be located a transformer distance 260 away from the opening into the common junction 218. As mentioned earlier, in this example both the seventh and eighth impedance matching elements 234 and 236 are shown as being part of a step transformer in the fourth waveguide 214; however, the step transformer may also optionally use only one impedance matching element in either narrow wall (i.e., either the seventh or eighth impedance matching elements 234 and 236) based on the predetermined design that reduces reflections looking into the fourth port 215.

Similar to FIG. 2E, FIG. 2F shows a bottom view cut along plane C-C' 248 showing the second, third, fourth, fifth, six, seventh, and eighth impedance matching elements 224, 226, 228, 230, 232, 234, and 236 in accordance with the present invention. Similar to view in FIG. 2E, both the seventh and eighth impedance matching elements 234 and 236 are shown as being part of a step transformer in the fourth waveguide 214 and they are shown to be located a transformer distance 260 away from the opening into the common junction 218. As described earlier, these are for example purpose and the step transformer may also optionally use only one impedance matching element in either narrow wall based on the predetermined design that reduces reflections looking into the fourth port 215. This bottom view also shows the common top wall 242 and example positions of the second, third, fourth, fifth, and sixth impedance matching elements 224, 226, 228, 230, and 232. In this example, the second and third matching impedance elements 224 and 226 are shown to be located along the centerline 250 of the first and second waveguides 202 and 206, respectively. Additionally, the second impedance matching element 224 is located a first post distance 256 away from the common junction 218 and the third impedance matching element 226 is located a second post distance 258 away from the common junction 218. Moreover, the sixth impedance matching element 232 is located a third post distance 260 away from the common junction 218. The sixth impedance matching element 232 may also be located along a centerline 262 of the fourth waveguide 214. The actual position of the sixth impedance matching element 232 is a predetermined design value that reduces reflections looking into the fourth port 215.

In this example, each impedance matching elements 222, 224, 226, 228, 230, 232, 234, and 236 may be fabricated as an all-metal or partial-metal element. The types of metals that may be used include any low loss type metals including copper, silver, aluminum, gold, or any metal that has a low bulk resistivity.

Turning to FIG. 3A, a side-view of an example of an implementation of the first impedance matching element 300 is shown in accordance with the present invention. In this example, the first impedance matching element 300 is shown to have a tip 302 that is cone shaped and a base 304 that is circular, which may have multiple steps 303 in the base that transition into the tip 302. In this example, the width 305 of the tip 302 may be equal to approximately 0.167 inches. The first impedance matching element 300 may be fabricated as an all-metal or partial-metal element. The types of metals that may be used include any low loss type metals including copper, silver, aluminum, gold, or any metal that has a low bulk resistivity. In FIG. 3B, a top view of the first impedance matching element 300 shown in accordance with the present invention. As mentioned earlier, the diameter 306 of the base 304 of the first impedance matching element 300 may be equal to approximately 1.14 inches; however, part of the diameter 306 may be truncated 308 so as to fit closer to the common narrow wall 252 (shown in FIGS. 2C, 2D, and 2E).

FIG. 4A is a top view of an example of an implementation of a 4-by-4 matrix waveguide network ("4×4 MWN") 400 having four EHT-couplers in accordance with the present invention. The 4×4 MWN 400 includes a first EHT-coupler 402, second EHT-coupler 404, third EHT-coupler 406, and fourth EHT-coupler 408 and a first bridge element 410 and a second bridge element 412. In general, the 4×4 MWN 400 physically resembles a "FIG. 8" with the first and second bridge elements 410 and 412 are configured to allow the waveguides of the 4×4 MWN 400 to fold back on itself. In this example, the first bridge element 410 is shown bending over the second bridge element 412, which is shown as bending in a downward direction. In this example, the E-plane ports 414, 416, 418, and 420 of all four EHT-couplers 402, 404, 406, and 408, respectively, are shown to be directed upwards from the 4×4 MWN 400. Moreover, the H-plane ports 422, 424, 426, and 428 of all four EHT-couplers 402, 404, 406, and 408, respectively, are shown as coplanar and perpendicular to the E-plane ports 414, 416, 418, and 420.

The 4×4 MWN 400 is configured such that the electrical length of the signal paths from each of the four EHT-couplers 402, 404, 406, and 408 to other EHT-couplers 402, 404, 406, and 408 is approximately equal. As such, the group delay and phase slope for all the signal paths between the EHT-couplers 402, 404, 406, and 408 is approximately equal.

As an example, from H-plane port to H-plane port, a first signal path is defined by the signal path from the H-plane port 422 of the first EHT-coupler 402 to the H-plane port 426 of the third EHT-coupler 402, a second signal path is defined by the signal path from the H-plane port 422 of the first EHT-coupler 402 to the H-plane port 428 of the fourth EHT-coupler 408, a third signal path is defined by the signal path from H-plane port 424 of the second EHT-coupler 404 to the H-plane port 426 of the third EHT-coupler 402, and a fourth signal path is defined by the signal path from H-plane port 424 of the second EHT-coupler 404 to the H-plane port 428 of the fourth EHT-coupler 408. Additional, from E-plane port to H-plane port, a fifth signal path is defined by the signal path from the E-plane port 414 of the first EHT-coupler 402 to the H-plane port 426 of the third EHT-coupler 402, a sixth signal path is defined by the signal path from the E-plane port 414 of the first EHT-coupler 402 to the H-plane port 428 of the fourth EHT-coupler 408, a seventh signal path is defined by the signal path from E-plane port 416 of the second EHT-coupler 404 to the H-plane port 426 of the third EHT-coupler 402, and an eighth signal path is defined by the signal path from E-plane port 416 of the second EHT-coupler 404 to the H-plane port 428 of the fourth EHT-coupler 408. Furthermore, from H-plane port to E-plane port, a ninth signal path is defined by the signal path from the H-plane port 422 of the first EHT-coupler 402 to the E-plane port 418 of the third EHT-coupler 402, a tenth signal path is defined by the signal path from the H-plane port 422 of the first EHT-coupler 402 to the E-plane port 420 of the fourth EHT-coupler 408, an eleventh signal path is defined by the signal path from H-plane port 424 of the second EHT-coupler 404 to the E-plane port 418 of the third EHT-coupler 402, and a twelfth signal path is defined by the signal path from H-plane port 424 of the second EHT-coupler 404 to the E-plane port 420 of the fourth EHT-coupler 408. Moreover, from E-pane port to E-plane port, a thirteenth signal path is defined by the signal path from the E-plane port 414 of the first EHT-coupler 402 to the E-plane port 418 of the third EHT-coupler 402, a fourteenth signal path is defined by the signal path from the E-plane port 414 of the first EHT-coupler 402 to the E-plane port 420 of the fourth EHT-coupler 408, a fifteenth signal path is defined by the signal path from E-plane port 416 of the second EHT-coupler 404 to the E-plane port 418 of the third EHT-coupler 402, and a sixteenth signal path is defined by the signal path from E-plane port 416 of the second EHT-coupler 404 to the E-plane port 420 of the fourth EHT-coupler 408. As an example, the 4×4 MWN 400 may have a two-dimensional size that is approximately about eight inches long 425 by five inches wide 427. In this example, the first, second, third, fourth, fifth, sixth, seventh, eighth, ninth, tenth, eleventh, twelfth, thirteenth, fourteenth, fifteenth, and sixteenth signal paths each have a group delay that is approximately equal and a phase slope that is approximately equal.

Moreover, FIG. 4B is a front view of the 4×4 MWN 400 and FIG. 4C is a side-view of the 4×4 MWN 400. Additionally, FIG. 4D is a side-view of an example of an implementation of the first bridge 410 of the 4×4 MWM 400 and FIG. 4E is a side-view of an example of an implementation of the second bridge 412 of the 4×4 MWM 400. Moreover, FIG. 4F is a prospective top-view of both the first bridge 410 and second bridge 412 placed on top of each other as shown in FIGS. 4A, 4B, and 4C in accordance with the present invention. In this example, the dimensions of both the first and second bridge 410 and 412 may be approximately the same where they have the approximately the same electrical length and the "plumbing" (i.e., the size and dimensions for the waveguide portions of each bridge) fit physically within the 4×4 MWN 400. Specifically, all that is generally needed of the first and second bridge 410 and 412 is that one path goes up a little (i.e., the first bridge 410) and the other goes down a little (i.e., the second bridge 412) such that they can form two paths that can cross each other to form the "FIG. 8" crossing point. The dimensions may be chose so as to properly fit within the 4×4 MWN 400 while providing the same electrical length in each bridge 410 and 412. As an example, in generally the both bridges 410 and 412 will extend upward or downward less than the waveguide broad wall dimension in height.

Figure 5:
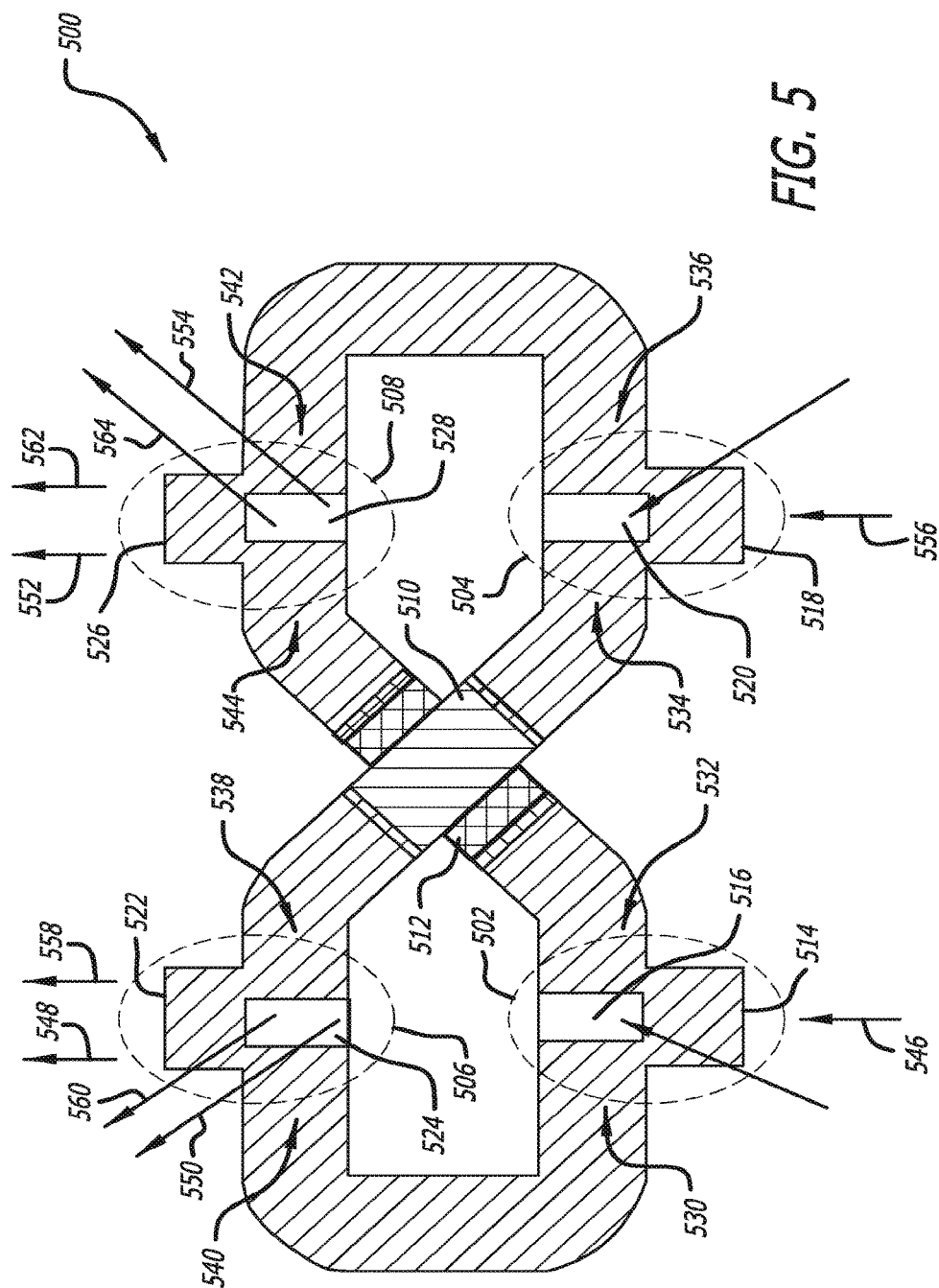
FIG. 5 is a top view of the 4×4 MWN shown in FIGS. 4A through 4D showing a signal flow of a first input signal into a first input port, through the 4×4 MWN, and out of both a first output port and second output port in accordance with the present invention.

In FIG. 5, a top view of the 4×4 MWN 500 is shown. As described earlier, the 4×4 MWN 500 includes a first EHT-coupler 502, second EHT-coupler 504, third EHT-coupler 506, and fourth EHT-coupler 508 and a first bridge element 510 and a second bridge element 512. The first EHT-coupler 502 includes an H-plane port 514 and an E-plane port 516. The second EHT-coupler 504 includes an H-plane port 518 and an E-plane port 520. The third EHT-coupler 506 includes an H-plane port 522 and an E-plane port 524. The fourth EHT-coupler 508 includes an H-plane port 526 and an E-plane port 528. The first EHT-coupler 502 also includes a first collinear port 530 and second collinear port 532. Additionally, the second EHT-coupler 504 also includes a first collinear port 534 and second collinear port 536. Moreover, the third EHT-coupler 506 also includes a first collinear port 538 and second collinear port 540. Furthermore, the fourth EHT-coupler 508 also includes a first collinear port 542 and second collinear port 544.

As an example of operation, if a first input signal 546 is injected into the H-plane port 514 of the first EHT-coupler 502, the first EHT-coupler 502 equally divides the first input signal 546 into two signals that are in-phase but have equal power values that are half the power of the original first input signal 546. This is sometimes referred to as splitting the first input signal 546 into two amplitude balanced in phase signals.

The first signal from the first EHT-coupler 502 is then passed along a first signal path from the first collinear port 530 of the first EHT-coupler 502 to the second collinear port 540 of the third EHT-coupler 506. Once the first signal is injected into the second collinear port 540 of the third EHT-coupler 506, the first signal is then equally divided into two additional signals (i.e., a third signal 548 and a fourth signal 550). The third signal 548 will be emitted from the H-plane port 522 of the third EHT-coupler 506 and the fourth signal 550 will be emitted from the E-plane port 524 of the third EHT-coupler 506. It is noted that while the third signal 548 and fourth signal 550 have equal amplitudes (that are half the power of the first signal resulting in a fourth of the power of the original first input signal 546), their phases may be in-phase or out-of-phase based on how the third EHT-coupler 506 is configured. The key is that the third EHT-coupler 506 is configured to produce a combined signal in the H-plane port 522 of two in-phase signals received at both the first collinear port 538 and second collinear port 540, while at the same time producing a difference signal in the E-plane port 524 of the two in-phase signals. If the two received signals received at both the first collinear port 538 and second collinear port 540 are 180 degrees out-of-phase, the H-plane port 522 will not produce an output signal but the E-plane port 524 will produce an output signal that is the a combined signal of the two received signals. As such, for this example, it will be assumed that the phase of the fourth signal 550 will be approximately equal to the phase of the third signal 548.

The second signal from the first EHT-coupler 502 is also passed along a second signal path from the second collinear port 532 of the first EHT-coupler 502, across the second bridge element 512, to the second collinear port 544 of the fourth EHT-coupler 508. Once the second signal is injected into the second collinear port 544 of the fourth EHT-coupler 508, the second signal is then equally divided into two additional signals (i.e., a fifth signal 552 and a sixth signal 554). The fifth signal 552 will be emitted from the H-plane port 526 of the fourth EHT-coupler 508 and the sixth signal 554 will be emitted from the E-plane port 528 of the fourth EHT-coupler 508. It is again noted that while the fifth signal 552 and sixth signal 554 have equal amplitudes (that are half the power of the second signal resulting in a fourth of the power of the original first input signal 546), their phases may be in-phase or out-of-phase based on how the fourth EHT-coupler 508 is configured. Similar to the third EHT-coupler 506, it is assumed that the phase of the sixth signal 554 will be approximately equal to the phase of the fifth signal 552.

Similarly, if a second input signal 556 is injected into the H-plane port 518 of the second EHT-coupler 504, the second EHT-coupler 504 also divides the second input signal 556 into two in-phase signals of equal amplitude (that is one half the power of the second input signal 556). The first signal from the second EHT-coupler 504 is then passed along a third signal path from the first collinear port 534 of the second EHT-coupler 504, across the first bridge element 510, to the first collinear port 538 of the third EHT-coupler 506.

Once the first signal is injected into the first collinear port 538 of the third EHT-coupler 506, the first signal is then equally divided into two additional signals (i.e., a seventh signal 558 and an eighth signal 560). The seventh signal 558 will be emitted from the H-plane port 522 of the third EHT-coupler 506 and the eighth signal 560 will be emitted from the E-plane port 524 of the third EHT-coupler 506. It is noted that while the seventh signal 558 and eighth signal 560 have equal amplitudes (that are half the power of the first signal resulting in a fourth of the power of the original second input signal 556), their phases may be in-phase or out-of-phase based on how the third EHT-coupler 506 is configured. Since the third signal 548 and fourth signal 550 have already been assumed to have the same phase, the seventh signal 558 and an eighth signal 560 are assumed to have phases a 180 degrees apart because, as noted earlier, the third signal 548 and seventh signal 558 have the same phase and would combine in the H-plane port 522, while the fourth signal 550 and eighth signal 560 are 180 degrees out-of-phase and would cancel in the E-plane port 524.

The second signal from the second EHT-coupler 504 is also passed along a second signal path from the second collinear port 536 of the second EHT-coupler 504 to the first collinear port 542 of the fourth EHT-coupler 508. Once the second signal is injected into the first collinear port 542 of the fourth EHT-coupler 508, the second signal is then equally divided into two additional signals (i.e., a ninth signal 562 and a tenth signal 564). The ninth signal 562 will be emitted from the H-plane port 526 of the fourth EHT-coupler 508 and the tenth signal 564 will be emitted from the E-plane port 528 of the fourth EHT-coupler 508. It is again noted that while the ninth signal 562 and tenth signal 564 have equal amplitudes (that are half the power of the second signal resulting in a fourth of the power of the original second input signal 556), their phases may be in-phase or out-of-phase based on how the fourth EHT-coupler 508 is configured. Similar to the third EHT-coupler 506, since the sixth signal 554 and fifth signal 552 have already been assumed to have the same phase, the ninth signal 562 and the tenth signal 564 are assumed to have phases 180 degrees apart because, as noted earlier, the fifth signal 552 and ninth signal 562 have the same phase and would combine in the H-plane port 526, while the sixth signal 554 and tenth signal 564 are 180 degrees out-of-phase and would cancel in the E-plane port 528. In this example, the third signal 548, fourth signal 550, fifth signal 552, a sixth signal 554, seventh signal 558, eighth signal 560, ninth signal 562, and tenth signal 564 all have approximately the same power amplitude level. Additionally, the third signal 548, fourth signal 550, fifth signal 552, a sixth signal 554, seventh signal 558, and ninth signal 562 have the same phase that is 180 degrees different from the phase of either the eighth signal 560 or tenth signal 564, where the tenth signal 564 has the same phase as the eighth signal 560.

Figure 6A:
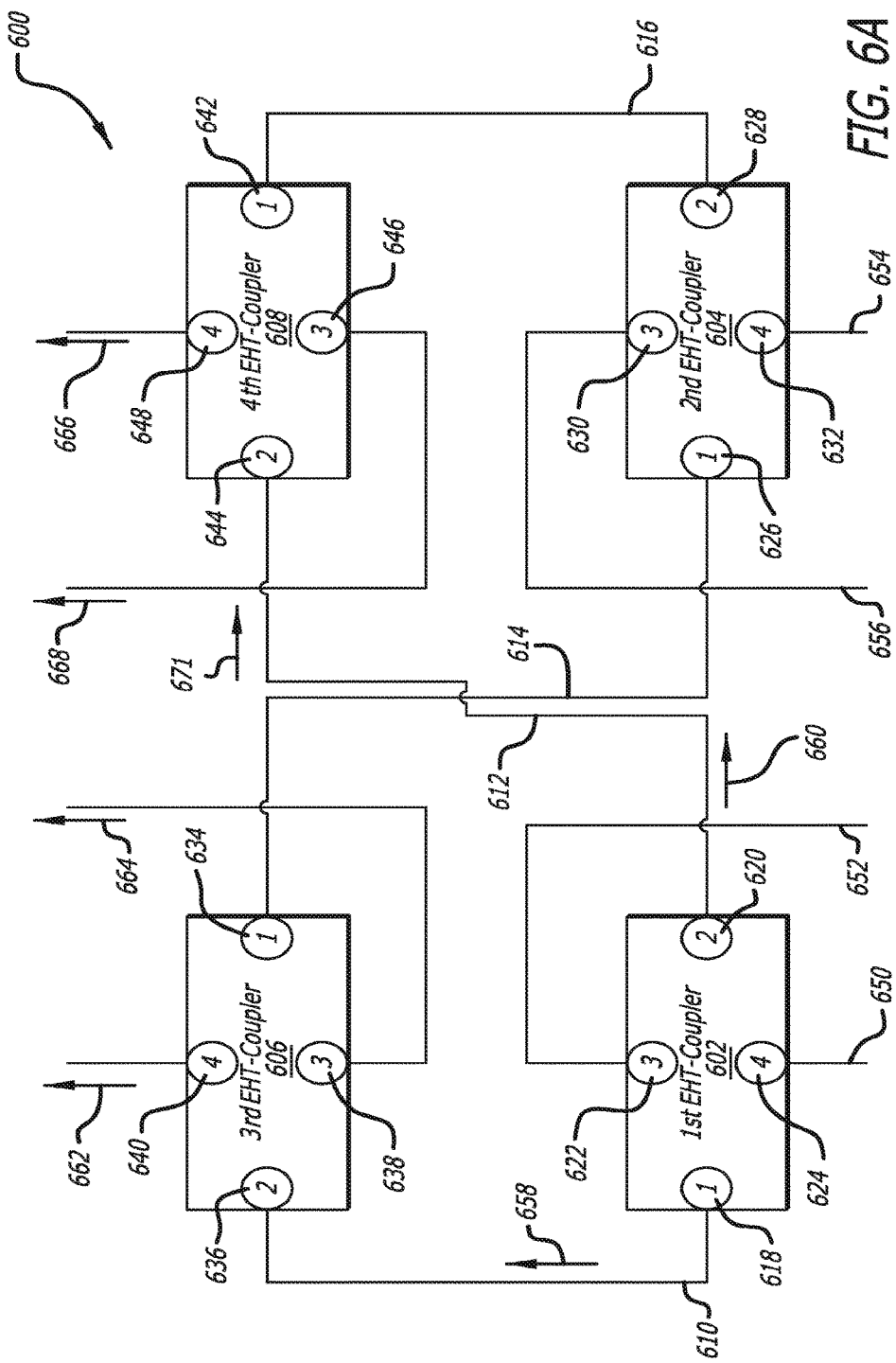
FIGS. 6A through 6D are circuit diagrams of a circuit that is representative of the 4×4 MWN shown in FIG. 5 in accordance with the present invention.

In FIG. 6A, a circuit diagram of a 4×4 MWN 600, which is representative of the 4×4 MWN 500 shown in FIG. 5, is shown in accordance with the present invention. This circuit diagram 600 describes the internal signals generated by each EHT-coupler and the corresponding signal paths that are utilized by these internal signals. As before, the circuit 600 of the 4×4 MWM includes a first EHF-coupler 602, second EHF-coupler 604, third EHF-coupler 606, and fourth EHF-coupler 608. The first EHF-coupler 602 is in signal communication with both the fourth EHF-coupler 608 and third EHF-coupler 606 via signal paths 610 and 612, respectively. Similarly, the second EHF-coupler 604 is in signal communication with both the third EHF-coupler 606 and fourth EHF-coupler 608 via signal paths 614 and 616, respectively. The first EHF-coupler 602 is isolated from the second EHF-coupler 604 and the third EHF-coupler 606 is isolated from the fourth EHF-coupler 608.

The first EHT-coupler 602 is a four port device that includes a first port 618, second port 620, third port 622, and fourth port 624. Additionally, the second EHT-coupler 604 is a four port device that includes a first port 626, second port 628, third port 630, and fourth port 632. Moreover, the third EHT-coupler 606 is a four port device that includes a first port 634, second port 636, third port 638, and fourth port 640. Furthermore, the fourth EHT-coupler 608 is a four port device that includes a first port 642, second port 644, third port 646, and fourth port 648.

In this example, all the first ports 618, 626, 634, and 642 and second ports 620, 628, 636, and 644 are collinear ports, all the third ports 622, 630, 638, and 646 are E-plane ports (i.e., difference ports), and all the fourth ports 624, 632, 640, and 648 are H-plane ports (i.e., summation ports). The first EHT-coupler 602 is in signal communication with the both the third EHT-coupler 606 and fourth EHT-coupler 608 as follows.

The first port 618 of the first EHT-coupler 602 is in signal communication with a second port 636 of the third EHT-coupler 606 via the first signal path 610 and the second port 620 of the first EHT-coupler 602 is in signal communication with the second port 644 of the fourth EHT-coupler 608 via the second signal path 612. Similarly, the second EHT-coupler 604 is in signal communication with the both the third EHT-coupler 606 and fourth EHT-coupler 608 as follows. The first port 626 of the second EHT-coupler 604 is in signal communication with the first port 636 of the third EHT-coupler 606 via the third signal path 614 and the second port 628 of the second EHT-coupler 604 is in signal communication with the first port 642 of the fourth EHT-coupler 608 via the fourth signal path 616.

The first signal path 610, second signal path 612, third signal path 614, and fourth signal path 616 all have approximately the same electrical length. Specifically, the first signal path 610 has a first group delay and a first phase slope; the second signal path 612 has a second group delay and a second phase slope; the third signal path 614 has a third group delay and a third phase slope; the third signal path 616 has a fourth group delay and a fourth phase slope; and where the first, second, third, and fourth group delays are approximately equal and the first, second, third, and fourth phase slopes are approximately equal.

As an example, the first EHT-coupler 602 is configured to receive a first input signal ("$S_{In_1}$") 650 at the fourth port 624, which is the H-plane port, and a second input signal ("$S_{In_2}$") 652 at the third port 622, which is the E-plane port. The $S_{In_1}$ 650 is assumed to have a first signal input amplitude ("$A_1$") and a first signal phase ("$\varphi_1$") and $S_{In_2}$ 652 is assumed to have a second signal amplitude ("$A_2$") and a second signal phase ("$\varphi_2$"). The second EHT-coupler 604 is configured to receive a third input signal ("$S_{In_3}$") 654 at the fourth port 632, which is the H-plane port, and a fourth input signal ("$S_{In_4}$") 656 at the third port 630, which is the E-plane port. The $S_{In_3}$ 650 is assumed to have a third signal input amplitude ("$A_3$") and a third signal phase ("$\varphi_3$") and $S_{In_4}$ 654 is assumed to have a fourth signal amplitude ("$A_4$") and a fourth signal phase ("$\varphi_4$").

Since each EHT-coupler of the plurality of couplers 602, 604, 606, and 608 is an improved hybrid coupler, each EHT-coupler is configured to provide the following output signals from the corresponding input signals (as described in table 1 below).

TABLE 1

| Input Port | Output Port |
| --- | --- |
| First Port | Third and fourth ports, where the power of the input signal at first port is split evenly between the third and fourth ports and the corresponding phases of the output signals at the third and fourth ports are in-phase with the input signal at the first port |
| Second Port | Third and fourth ports, where the power of the input signal at the first port is split evenly between the third and fourth ports and the corresponding phases of the output signals at third and fourth ports are 180 degrees out-of-phase, where the phase of the output signal of the fourth port is in-phase with the input signal of the second port, where the phase of the output signal at the third port is a 180 degrees out-of-phase with the phase of the input signal at the second port |
| Third Port | First and second ports, where the power of the input signal at the third port is split evenly between first and second ports and the corresponding phases of the output signals at the first and second ports are 180 degrees out-of-phase. |
| Fourth Port | First and second ports, where the power of the input signal at the fourth port is split evenly between the first and second ports and the corresponding phases of the output signals at the first and second ports are in-phase with the input signal at the first port |

The resulting scattering matrix for the EHT-coupler is then $$S = \frac{1}{\sqrt{2}} \begin{bmatrix} 0 & 0 & 1 & 1 \\ 0 & 0 & -1 & 1 \\ 1 & -1 & 0 & 0 \\ 1 & 1 & 0 & 0 \end{bmatrix}.$$

In this example, it is appreciated that the first and second ports of each EHT-coupler are collinear ports such that an input signal injected into the second port produces two output signals at the third and fourth ports. These two output signals have phases that are 180 degrees apart. For purposes of illustration, the phase of the output signal at the fourth port is assumed to be in phase (i.e., the same phase) with the phase of the input signal at the second port and the phase of the output signal at the third port is assumed to be out-of-phase (i.e., 180 degrees of phase difference) with the phase of the input signal at the second port. Additionally, an input signal injected into the third port produces two output signals at the first and second ports where the two output signals have phases that are 180 degrees apart. In this example, it is assumed that the phase of the output signal at the first port is in phase with the third port and 180 degrees apart from the phase of the output signal at the second port.

As an example of operation, the EHT-coupler 600 is configured to receive the $S_{In_1}$ 650 at the fourth port 624 and evenly divides it into a first EHT-coupler signal ("$S_{ETH_{1,1}}$") 658 of the first EHT-coupler 602 and a second EHT-coupler signal ("$S_{ETH_{1,2}}$") 660 of the first EHT-coupler 602, where each signal has a amplitude equal to approximately $\frac{1}{2}A_1$ and a phase that is approximately equal to $\varphi_1$. The $S_{ETH_{1,1}}$ 658 is then passed to the second port 636 of the third EHT-coupler 606 via the first signal path 610. Once injected into the second port 636 of the third EHT-coupler 606, the third EHT-coupler 606 evenly divides it into a first output signal ("$S_{Out_1}$") 662 of the third EHT-coupler 606 and a second output signal ("$S_{Out_2}$") 664 of the third EHT-coupler 606, where each output signal has a amplitude equal to approximately $\frac{1}{4}A_1$ and a phase that is approximately equal to $\varphi_1$ for $S_{Out_1}$ 662 and $\varphi_1$ plus 180 degrees for $S_{Out_2}$ 664. In this example, the $S_{Out_1}$ 662 is emitted from the fourth port 640 and the $S_{Out_2}$ 664 is emitted from the third port 638.

Similarly, the $S_{ETH_{1,2}}^2$ 660 is then passed to the second port 644 of the fourth EHT-coupler 608 via the second signal path 612. Once injected into the second port 644, the fourth EHT-coupler 608 evenly divides it into a third output signal ("$S_{Out_3}$") 666 of the fourth EHT-coupler 608 and a fourth output signal ("$S_{Out_4}$") 668 of the fourth EHT-coupler 608, where each output signal has a amplitude equal to approximately $\frac{1}{4}A_1$ and a phase that is approximately equal to $\varphi_1$ for $S_{Out_3}$ 666 and $\varphi_1$ plus 180 degrees for $S_{Out_4}$ 668. Again, in this example, the $S_{Out_3}$ 666 is emitted from the fourth port 648 and the $S_{Out_4}$ 668 is emitted from the third port 646. It is noted that in FIG. 6A the signal paths corresponding to the active signals are emphasized in bold for the purpose of better illustrating the signal flow through the circuit diagram 600.

Figure 6B:
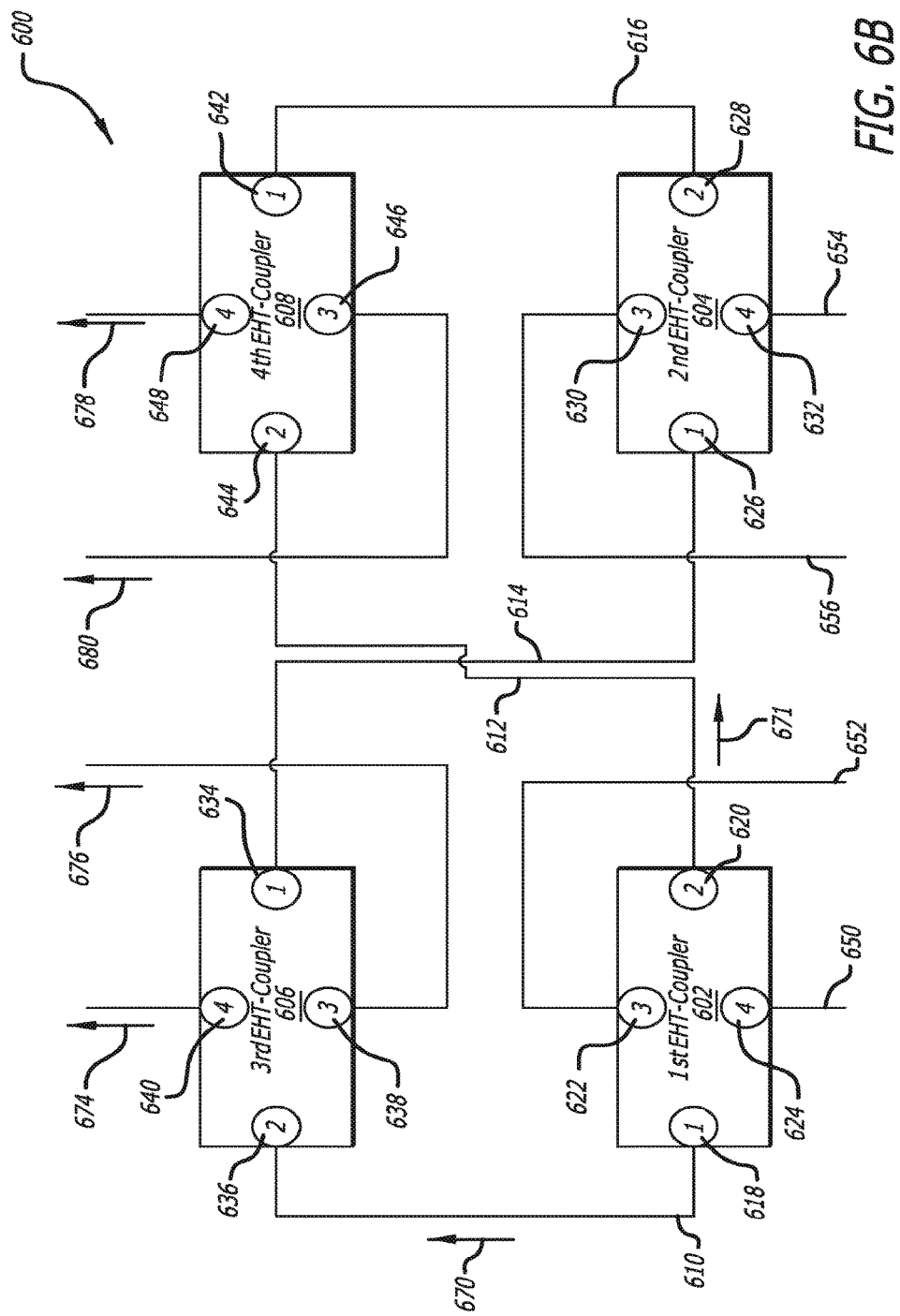

In FIG. 6B, the EHT-coupler 600 is also configured to receive the $S_{In_2}$ 652 at the third port 622 and evenly divide it into a third EHT-coupler signal ("$S_{ETH_{1,3}}$") 670 of the first EHT-coupler 602 at the first port 670 and a fourth EHT-coupler signal ("$S_{ETH_{1,4}}$") 671 of the first EHT-coupler 602 at the second port 620, where each signal has a amplitude equal to approximately $\frac{1}{2}A_1$ and a phase that is approximately equal to $\varphi_1$ for $S_{ETH_{1,3}}$ 670 and $\varphi_1$ plus 180 degrees for $S_{ETH_{1,4}}$ 671. The $S_{ETH_{1,3}}$ 670 is then passed to the second port 636 of the third EHT-coupler 606 via the first signal path 610 and $S_{ETH_{1,4}}$ 671 is passed to the second port 644 of the fourth EHT-coupler 608 via the second signal path 612.

Once the $S_{ETH_{1,3}}$ 670 is injected into the second port 636, the third EHT-coupler 606 evenly divides it into a fifth output signal ("$S_{Out_5}$") 674 that is emitted from the fourth port 640 and a sixth output signal ("$S_{Out_6}$") 676 that is emitted from the third port 638, where each output signal has an amplitude equal to approximately $\frac{1}{4}A_2$ and a phase that is approximately equal to $\varphi_2$ for $S_{Out_5}$ 674 and $\varphi_2$ plus 180 degrees for $S_{Out_6}$ 676. Similarly, once the $S_{ETH_{1,4}}$ 671 is injected into the second port 644 of the fourth EHT-coupler 608, the fourth EHT-coupler 608 evenly divides it into a seventh output signal ("$S_{Out_7}$") 678 that is emitted from the fourth port 648 and an eighth output signal ("$S_{Out_8}$") 680 that is emitted from the third port 646, where each output signal has a amplitude equal to approximately $\frac{1}{4}A_2$ and a phase that is approximately equal to $\varphi_2$ plus 180 degrees for $S_{Out_7}$ 678 and $\varphi_2$ degrees for $S_{Out_8}$ 680. It is again noted that in FIG. 6B the signal paths corresponding to the active signals are emphasized in bold for the purpose of better illustrating the signal flow through the circuit diagram 600.

Figure 6C:
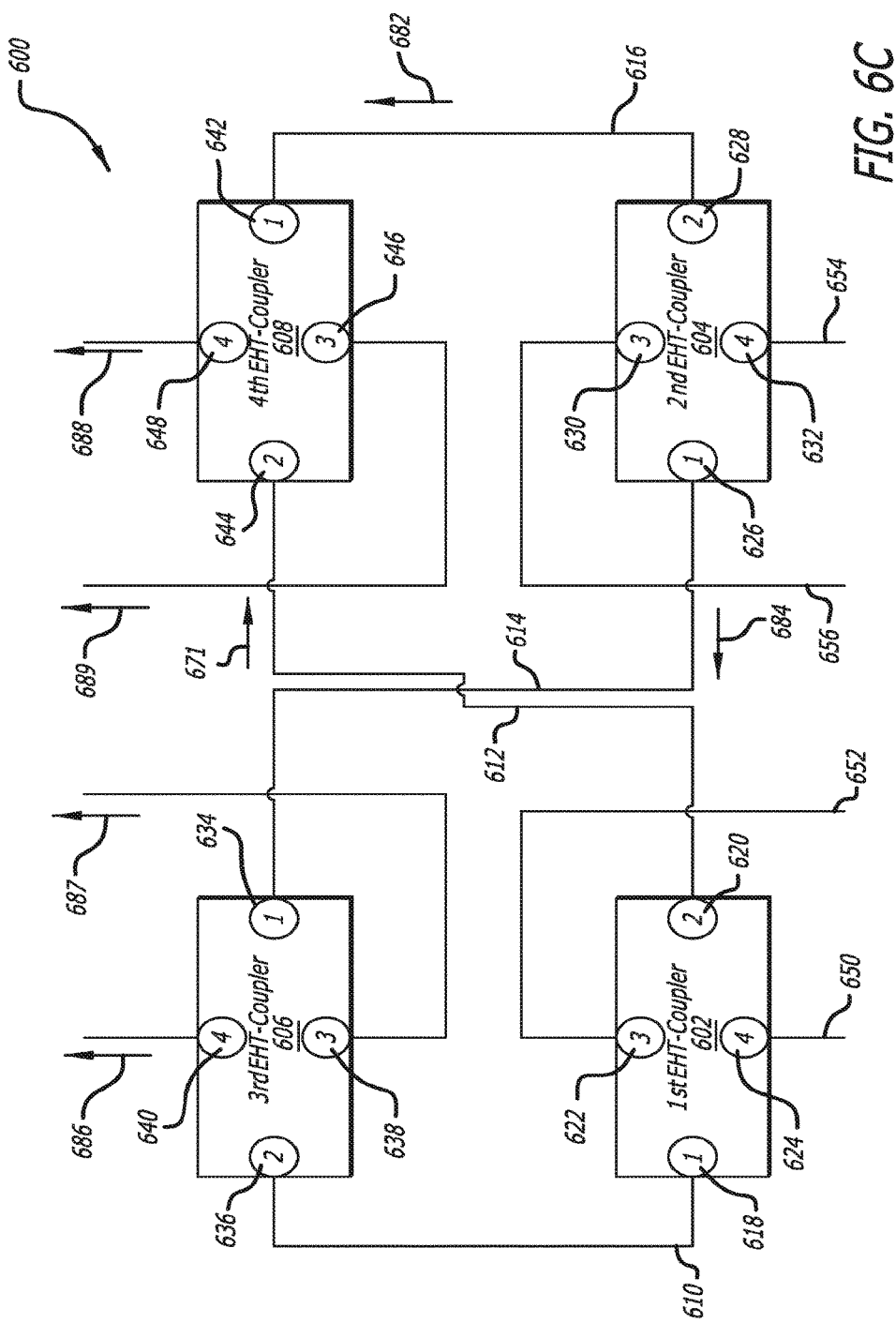

Turning to FIG. 6C, the EHT-coupler is further configured to configured to receive the $S_{In_3}$ 654 at the fourth port 632 and evenly divides it into a first EHT-coupler signal ("$S_{ETH_{2,1}}$") 682 of the second EHT-coupler 604 and a second EHT-coupler signal ("$S_{ETH_{2,2}}$") 684 of the second EHT-coupler 604, where each signal has a amplitude equal to approximately $\frac{1}{2}A_3$ and a phase that is approximately equal to $\varphi_3$. The $S_{ETH_{2,2}}$ 684 is then passed to the first port 634 of the third EHT-coupler 606, via the third signal path 614, and $S_{ETH_{2,1}}$ 682 is also passed to the first port 642 of the fourth EHT-coupler 608 via the fourth signal path 616. Once injected into the first port 634 of the third EHT-coupler 606, the third EHT-coupler 606 evenly divides it into a ninth output signal ("$S_{Out_9}$") 686 of the third EHT-coupler 606 and a tenth output signal ("$S_{Out_{10}}$") 687 of the third EHT-coupler 606, where each output signal has a amplitude equal to approximately $\frac{1}{4}A_3$ and a phase that is approximately equal to $\varphi_3$. In this example, it is noted that the $S_{Out_9}$ 686 is emitted from the fourth port 640 and the $S_{Out_{10}}$ 687 is emitted from the third port 638.

Similarly, once injected into the first port 642 of the fourth EHT-coupler 608, the fourth EHT-coupler 608 evenly divides it into a eleventh output signal ("$S_{Out_{11}}$") 688 of the third EHT-coupler 606 and a twelfth output signal ("$S_{Out_{12}}$") 689 of the fourth EHT-coupler 608, where each output signal has a amplitude equal to approximately $\frac{1}{4}A_3$ and a phase that is approximately equal to $\varphi_3$. In this example, it is noted that the $S_{Out_{11}}$ 688 is emitted from the fourth port 648 and the $S_{Out_{12}}$ 689 is emitted from the third port 646. It is still again noted that in FIG. 6C the signal paths corresponding to the active signals are emphasized in bold for the purpose of better illustrating the signal flow through the circuit diagram 600.

Figure 6D:
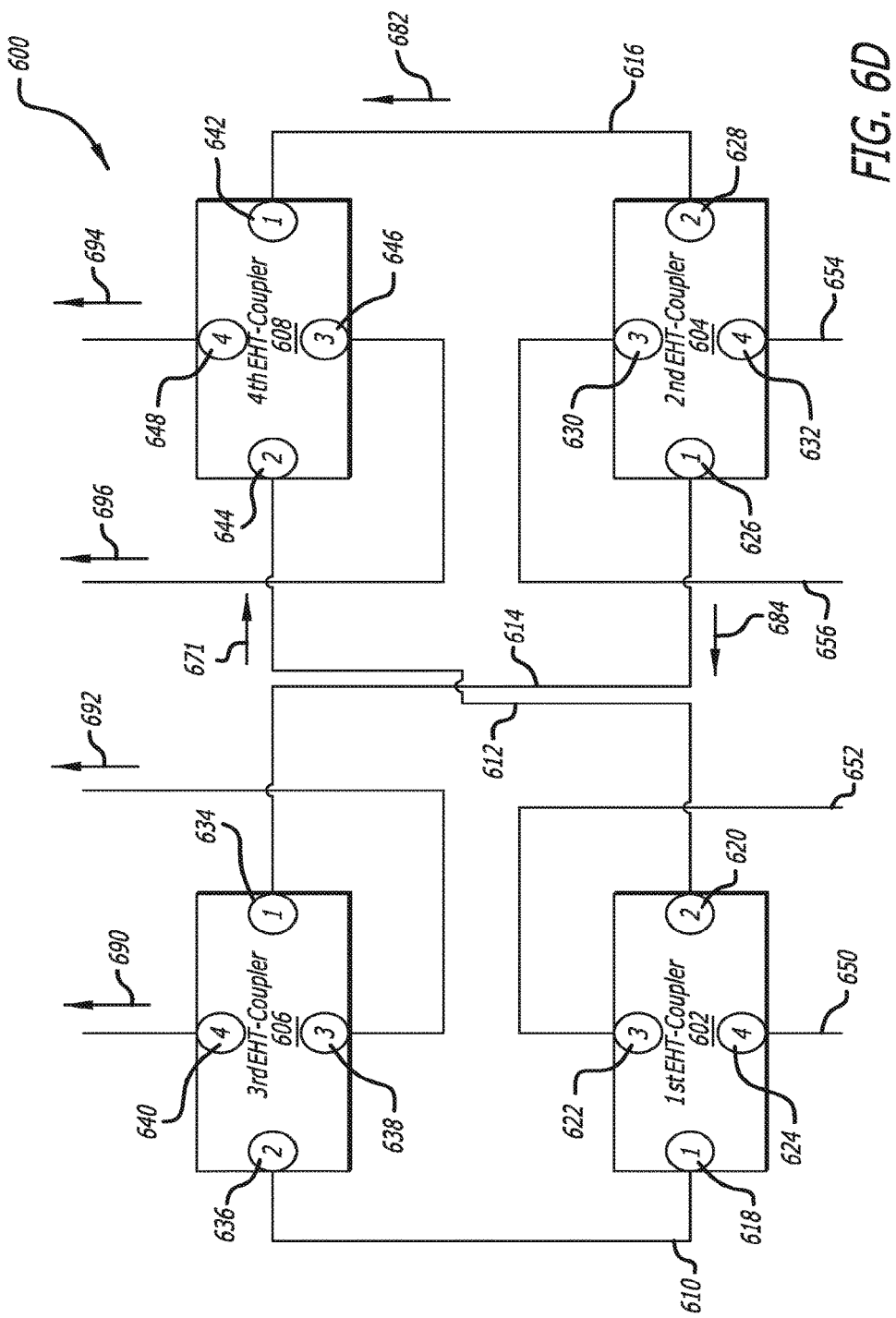

Turning to FIG. 6D, it is appreciated by those of ordinary skill in the art that using the same methodology with regards to input signal $S_{In_4}$ 654, it can be shown that the thirteenth output signal ("$S_{Out_{13}}$") 690, fourteenth ("$S_{Out_{14}}$") 692, fifteenth ("$S_{Out_{15}}$") 694, and sixteenth ("$S_{Out_{16}}$") 696 all have an amplitude equal to approximately $\frac{1}{4}A_4$ and a phase that is approximately equal to $\varphi_4$ for output signals $S_{Out_{13}}$ 690 and $S_{Out_{14}}$ 692 and $\varphi_4$ plus 180 degrees for signals $S_{Out_{15}}$ 694 and $S_{Out_{16}}$ 696. In summary, table 2 below shows the amplitudes and phase for the output signals corresponding to the input signals as described above in relation to FIGS. 6A to 6C.

TABLE 2

| | Out | | | |
|---|---|---|---|---|
| In | 3rd EHT-Coupler - 3rd Port | 3rd EHT-Coupler - 4th Port | 4th EHT-Coupler - 3rd Port | 4th EHT-Coupler - 4th Port |
| 1st EHT-Coupler - 3rd Port $S_{In_1}$ | $S_{Out_1}$ $\frac{1}{4} A_1, \varphi_1$ | $S_{Out_2}$ $\frac{1}{4} A_1, \varphi_1 + 180$ | $S_{Out_3}$ $\frac{1}{4} A_1, \varphi_1$ | $S_{Out_4}$ $\frac{1}{4} A_1,$ $\varphi_1 + 180$ |
| 1st EHT-Coupler - 4th Port $S_{In_2}$ | $S_{Out_5}$ $\frac{1}{4} A_2, \varphi_2$ | $S_{Out_6}$ $\frac{1}{4} A_2, \varphi_2 + 180$ | $S_{Out_7}$ $\frac{1}{4} A_2, \varphi_2 + 180$ | $S_{Out_8}$ $\frac{1}{4} A_2, \varphi_2$ |
| 2nd EHT-Coupler - 3rd Port $S_{In_3}$ | $S_{Out_9}$ $\frac{1}{4} A_3, \varphi_3$ | $S_{Out_{10}}$ $\frac{1}{4} A_3, \varphi_3$ | $S_{Out_{11}}$ $\frac{1}{4} A_3, \varphi_3$ | $S_{Out_{12}}$ $\frac{1}{4} A_3, \varphi_3$ |
| 2nd EHT-Coupler - 4th Port $S_{In_4}$ | $S_{Out_{13}}$ $\frac{1}{4} A_4, \varphi_4$ | $S_{Out_{14}}$ $\frac{1}{4} A_4, \varphi_4$ | $S_{Out_{15}}$ $\frac{1}{4} A_4, \varphi\varphi_4 + 180$ | $S_{Out_{16}}$ $\frac{1}{4} A_4,$ $\varphi_4 + 180$ |

Assuming that the input phases (i.e., $\varphi_1, \varphi_2, \varphi_3$, and $\varphi_4$) are all normalized to zero and the input amplitudes (i.e., $A_1, A_2, A_3$, and $A_4$) are normalized to 1, the resulting example scattering matrix for the 4×4 MWN 600 is then and 8 by 8 matrix shown as $$S = \frac{1}{\sqrt{4}} \begin{bmatrix} 0 & 0 & 0 & 0 & 1 & -1 & 1 & -1 \\ 0 & 0 & 0 & 0 & 1 & -1 & -1 & 1 \\ 0 & 0 & 0 & 0 & 1 & 1 & 1 & 1 \\ 0 & 0 & 0 & 0 & 1 & 1 & -1 & -1 \\ 1 & 1 & 1 & 1 & 0 & 0 & 0 & 0 \\ -1 & -1 & 1 & 1 & 0 & 0 & 0 & 0 \\ 1 & -1 & 1 & -1 & 0 & 0 & 0 & 0 \\ -1 & 1 & 1 & -1 & 0 & 0 & 0 & 0 \end{bmatrix}.$$

Turning to FIG. 7A, a top view of the 4×4 MWN 700 is shown in signal communication with a fifth and sixth EHT-couplers 702 and 704 via a first signal path 706 and a second path 708, respectively, in accordance with the present invention. Related to FIG. 7A, in FIG. 7B, a side-view of the 4×4 MWN 700, sixth EHT-coupler 704, and second signal path 708 is shown. The 4×4 MWN 700 is assumed to be the same as the 4×4 MWNs 500 and 600 described in FIGS. 5 and 6. As described earlier, the 4×4 MWN 700 includes a first, second, third, and fourth EHT-couplers 710, 712, 714, and 716, respectively. In this top view of the combination of the 4×4 MWN 700 with the fifth and sixth EHT-couplers 702 and 704, the E-plane ports of the 4×4 MWN 700 are hidden and extend downward from the 4×4 MWN 700, as opposed to the view of the 4×4 MWN 500 of FIG. 5 that shows the E-plane ports 516, 520, 524, and 528 extending upward from the 4×4 MWN 500. The first EHT-coupler 710 includes a first 717, a second 718, third (not shown), and a fourth 720 port. The first EHT-coupler 710 also includes a third 722 port that is not visible in the top view of FIG. 7A but is shown in side-view of FIG. 7B. Similarly, the second EHT-coupler 712 includes a first 724, second 726, third (not shown), and fourth port 728. The third EHT-coupler 714 includes a first 730, second 732, third 734 (shown in FIG. 7B), and fourth 736 port and the fourth EHT-coupler 716 includes a first 738, second 740, third (not shown), and fourth port 742. The fifth EHT-coupler 702 includes a first 744, second 746, third 748, and fourth 750 port and the sixth EHT-coupler 704 also includes a first 752, second 754, third 756, and fourth 758 port. The fourth port 742 of the fourth EHT-coupler 716 is in signal communication with the fourth port 750 of the fifth EHT-coupler 702 via the first signal path 706 and fourth port 736 of the third EHT-coupler 714 is in signal communication with the fourth port 758 of the sixth EHT-couplers 704 via the second signal path 708. In this example, the electrical length of the first and second signal paths 706 and 708 are approximately the same as such that they have approximately equal group delay and phase slope.

In FIG. 8A, a top view of the 4×4 MWN 700, of FIGS. 7A and 7B, is shown in signal communication with a seventh and eighth EHT-coupler 800 and 802 via a third signal path 804 and a fourth path 806, respectively, in accordance with the present invention. Related to FIG. 8A, in FIG. 8B, a side-view of the 4×4 MWN 700, sixth EHT-coupler 704, second signal path 708, eighth EHT-coupler 802, and fourth signal path 806 is shown. The seventh EHT-coupler 800 includes a first port 804, second port 806, third port (not shown), and fourth port 808. Similarly, the eighth EHT-coupler 802 includes a first port 812, second port 814, third port 816, and fourth port 818. In this example, the third port (i.e., E-plane port) of the fourth EHT-coupler 716 is in signal communication with the third port (i.e., E-plane port) of the seventh EHT-coupler 800, via signal path 804, and the third port 734 (i.e., E-plane port) of the third EHT-coupler 714 is in signal communication with the third port 816 (i.e., E-plane port) of the eighth EHT-coupler 802 via signal path 806. In this example the electrical length of the first, second, third, and fourth signal paths 706, 708, 804, and 806 are approximately the same as such that they have the approximately equal group delay and phase slope.

Turning to FIG. 9A, a top view of an example of an implementation of a PDRN utilizing an 8-by-8 hybrid matrix waveguide network ("8×8 MWN") 900 is shown. Related to FIG. 9A, in FIG. 9B, a side-view of the PDRN is shown. The 8×8 MWN 900 includes two 4×4 MWNs (i.e., a first 4×4 MWN and a second 4×4 MWN 902). Specifically, in this example, the first 4×4 MWN is the 4×4 MWN 700 shown in FIGS. 7A, 7B, 8A, and 8B. Additionally, the 8×8 MWN 900 also includes the fifth, sixth, seventh, and eighth EHT-couplers 702, 704, 800, and 802 and the first, second, third, and fourth signal paths 706, 708, 804, and 806, all shown in FIGS. 8A and 8B. In this example, the second 4×4 MWN 902 is in signal communication with the fifth 702, sixth 704, seventh 800, and eighth 802 EHT-couplers via a fifth 904, sixth 906, seventh 908, and eighth 910 signal paths, respectively. In this example, the second 4×4 MWN 902 is in an opposite configuration than the first 4×4 MWN 700. Specifically, unlike the first 4×4 MWN 700, the second 4×4 MWN 902 has all four E-plane ports pointing out of the page. For the purpose of illustration, the 4×4 MWN 900 also includes four EHT-couplers of which the first EHT-coupler 912, second EHT-coupler 914 are fully visible and third EHT-coupler 916 and forth EHT-coupler 918 are not fully visible.

In this example, the signal paths 706, 708, 804, 806, 904, 906, 908, and 910 are shown to be waveguide runs that are symmetric in pairs. Specifically, the first signal path 706 is symmetric with the eighth signal 910 path. The second signal path 708 is symmetric with the seventh signal path 908. The third signal path 804 is symmetric with the sixth signal path 906 and the fourth signal path 806 is symmetric with the fifth signal path 904. In addition to having symmetric pairs, all the signal paths 706, 708, 804, 806, 904, 906, 908, and 910 have approximately the same electrical length such that they have the approximately equal group delay and phase slope. As an example, the physical line length of waveguide ports of the signal paths may be approximately between six to seven inches of line length based on the frequency of operation and the dimensions of the 8×8 MWN 900 and 4×4 MWNs.

Figure 10:
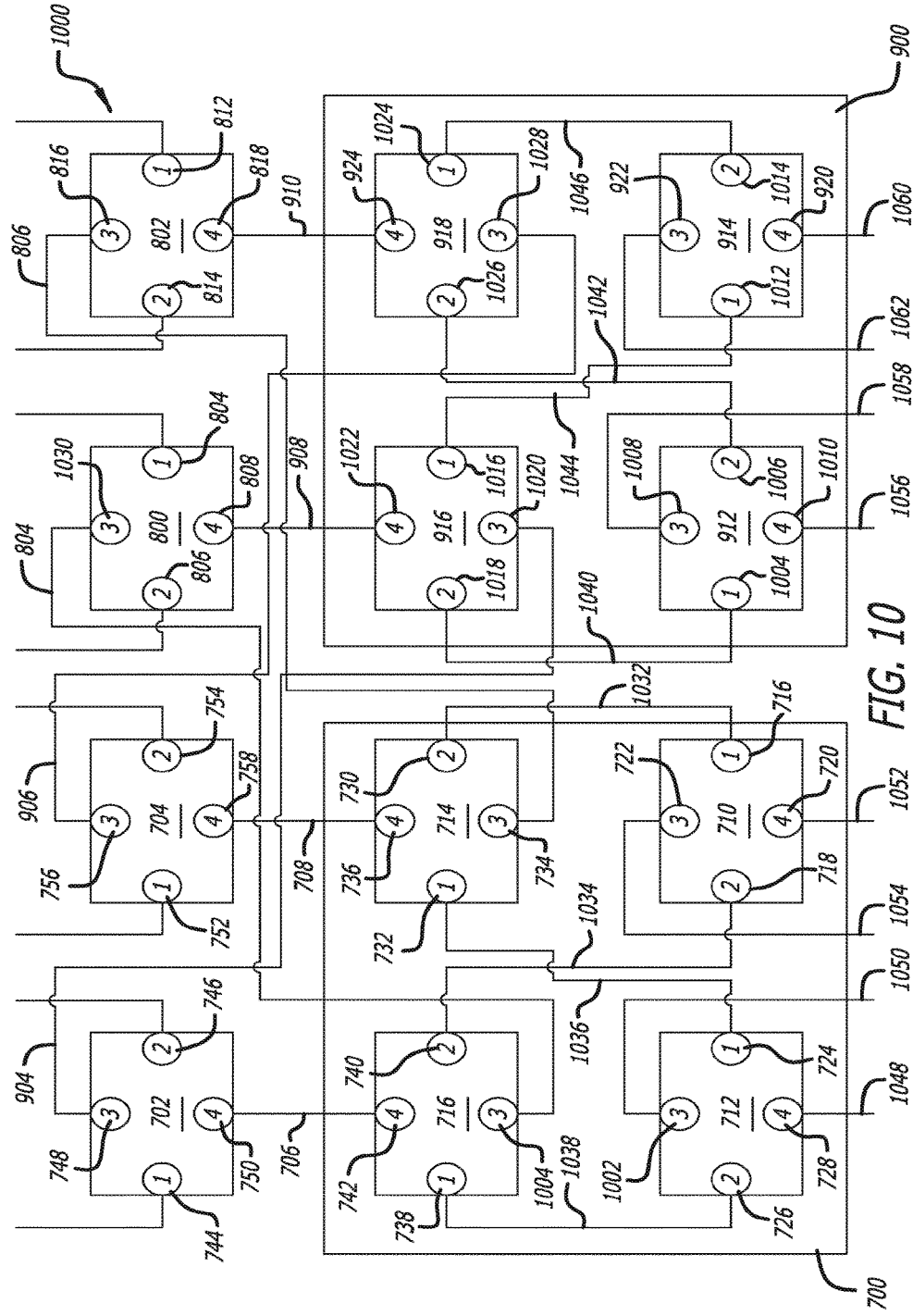
FIG. 10 is a circuit diagram of a circuit equivalent of the PDRN shown in FIGS. 9A and 9B in accordance with the present invention.

FIG. 10 is a circuit diagram of a circuit equivalent of the PDRN 1000 shown in FIGS. 9A and 9B in accordance with the present invention. The circuit diagram of the PDRN 1000 is representative of the 8×8 MWN 900 shown in FIGS. 9A and 9B. Similar to the circuit diagram 600 shown in FIGS. 6A through 6C, this PDRN 1000 circuit diagram describes the internal signals generated by each EHT-coupler and the corresponding signal paths that are utilized by these internal signals. Additionally, similar to the 8×8 MWN 900, of FIGS. 9A and 9B, the PDRN 1000 includes the first 4×4 MWN 700 and the second 4×4 MWN 900 in signal communication with the fifth, sixth, seventh, and eighth EHT-couplers 702, 704, 800, and 802, respectively.

The first 4×4 MWN 700 includes the first, second, third, and fourth EHT-couplers 710, 712, 714, and 716 and the second 4×4 MWN 900 includes the first, second, third, and fourth EHT-couplers 912, 914, 916, and 918. As described earlier, in the first 4×4 MWN 700, the first EHT-coupler 710 includes a first 716, second 718, third 722, and fourth 720 port and the second EHT-coupler 712 includes a first 724, second 726, third 1002, and fourth 728 port. Additionally, the third EHT-coupler 714 includes a first 732, second 730, third 734, and fourth 736 port and the fourth EHT-coupler 716 includes a first 738, second 740, third 1002, and fourth 742 port. Similarly, in the second 4×4 MWN 900, the first EHT-coupler 912 includes a first 1004, second 1006, third 1008, and fourth 1010 port and the second EHT-coupler 914 includes a first 1012, second 1014, third 922, and fourth 920 port. Additionally, the third EHT-coupler 916 includes a first 1016, second 1018, third 1020, and fourth 1022 port and the fourth EHT-coupler 918 includes a first 1024, second 1026, third 1028, and fourth 924 port. Moreover, the fifth EHT-coupler 702 includes a first 744, second 746, third 748, and fourth 750 port; the sixth EHT-coupler 704 includes a first 752, second 754, third 756, and fourth 758 port; the seventh EHT-coupler 800 includes a first 804, second 806, third 1030, and fourth 808 port; and the eighth EHT-coupler 802 includes a first 812, second 814, third 816, and fourth 818 port.

Turning back to the first 4×4 MWN 700, the first port 716 of the first EHT-coupler 710 is in signal communication with the second port 730 of the third EHT-coupler 714 via signal path 1032 and the second port 718 of the first EHT-coupler 710 is in signal communication with the second port 740 of the fourth EHT-coupler 716 via signal path 1034. The first port 724 of the second EHT-coupler 712 is in signal communication with the first port 732 of the third EHT-coupler 714 via signal path 1036 and the second port 726 of the second EHT-coupler 712 is in signal communication with the first port 738 of the fourth EHT-coupler 716 via signal path 1038. Similarly, within the second 4×4 MWN 900, the first port 1004 of the first EHT-coupler 912 is in signal communication with the second port 1018 of the third EHT-coupler 916 via signal path 1040 and the second port 1006 of the first EHT-coupler 912 is in signal communication with the second port 1026 of the fourth EHT-coupler 918 via signal path 1042. The first port 1012 of the second EHT-coupler 914 is in signal communication with the first port 1016 of the third EHT-coupler 916 via signal path 1044 and the second port 1014 of the second EHT-coupler 914 is in signal communication with the first port 1024 of the fourth EHT-coupler 918 via signal path 1046.

Moreover, the fourth port 742 of the fourth EHT-coupler 716 of the first 4×4 MWN 700 is in signal communication with the fourth port 750 of the fifth EHT-coupler 702, via signal path 706, and the third port 1004 of the fourth EHT-coupler 716 is in signal communication with the third port 1030 of the seventh EHT-coupler 800 via signal path 804. The fourth port 736 of the third EHT-coupler 714 of the first 4×4 MWN 700 is in signal communication with the fourth port 758 of the sixth EHT-coupler 704, via signal path 708, and the third port 734 of the third EHT-coupler 714 is in signal communication with the third port 816 of the eighth EHT-coupler 802 via signal path 806. The fourth port 942 of the fourth EHT-coupler 918 of the second 4×4 MWN 900 is in signal communication with the fourth port 818 of the eighth EHT-coupler 802, via signal path 910, and the third port 1028 of the fourth EHT-coupler 918 is in signal communication with the third port 756 of the sixth EHT-coupler 704 via signal path 906. The fourth port 1022 of the third EHT-coupler 916 is in signal communication with the fourth port 808 of the seventh EHT-coupler 800, via signal path 908, and the third port 1020 of the third EHT-coupler 916 is in signal communication with the third port 748 of the fifth EHT-coupler 702 via signal path 904.

Again, it is appreciated that in this example, within the first 4×4 MWN 700, the first EHT-coupler 712 is isolated from the second EHT-coupler 710 and the third EHT-coupler 714 is isolated from the fourth EHT-coupler 716. Likewise, within the second 4×4 MWN 900, the first EHT-coupler 910 is isolated from the second EHT-coupler 912 and the third EHT-coupler 916 is isolated from the fourth EHT-coupler 918. Additionally, the eight signal paths 706, 708, 804, 806, 904, 906, 908, and 910 all have approximately the same electrical length. Generally, the term "electrical length" is the length of a transmission medium (i.e., a signal path) that is expressed as a number of wavelength of a signal propagating through the medium. It is appreciated by those of ordinary skill that the term electrical length references to effective length of a signal path as "seen" by the propagated signal traveling through the signal path and is frequency dependent based on the frequency of the propagated signal. As an example, if a signal path is a WR-75 rectangular waveguide (having frequency limits of approximately 10.0 GHz to 15.0 GHz) and the signal path is, for example, physically 6 inches long, the electrical length would be 5.0835 wavelengths at 10.0 GHz, 5.5919 wavelengths at 11.0 GHz, 6.1002 wavelengths at 12.0 GHz, 6.6086 wavelengths at 13.0 GHz, 7.1169 wavelengths at 14.0 GHz, and 7.6253 wavelengths at 15.0 GHz. Since electrical length is measured as the number of wavelength at a given frequency as it propagates along the signal path, the group delay is the measure of the time delay of the amplitude envelopes of the various sinusoidal components of the propagated signal through the signal path. Additionally, the phase delay is the measure of the time delay of the phase as opposed to the time delay of the amplitude envelope. When utilized in this application, the phrase "having approximately the same electrical length" for two or more path lengths refers to the physical property that the group delays are approximately equal as are the phase slopes.

Turning back to FIG. 10, as an example of operation, the second EHT-coupler 712 within the first 4×4 MWN 700 is configured to receive a first input signal ("$S_{In}^1$") 1048 at the fourth port 728, which is the H-plane port, and a second input signal ("$S_{In}^2$") 1050 at the third port 1002, which is the E-plane port. The $S_{In}^1$ 1048 is assumed to have a first signal input amplitude ("$A_1$") and a first signal phase ("$\varphi_1$") and $S_{In}^2$ 1050 is assumed to have a second signal amplitude ("$A_2$") and a second signal phase ("$\varphi_2$"). The first EHT-coupler 710 is configured to receive a third input signal ("$S_{In}^3$") 1052 at the fourth port 720, which is the H-plane port, and a fourth input signal ("$S_{In}^4$") 1054 at the third port 722, which is the E-plane port. The $S_{In}^3$ 1052 is assumed to have a third signal input amplitude ("$A_3$") and a third signal phase ("$\varphi_3$") and $S_{In}^4$ 1054 is assumed to have a fourth signal amplitude ("$A_4$") and a fourth signal phase ("$\varphi_4$"). Similarly, the first EHT-coupler 912, within the second 4×4 MWN 700, is configured to receive a fifth input signal ("$S_{In}^5$") 1056 at the fourth port 1010, which is the H-plane port, and a sixth input signal ("$S_{In}^6$") 1058 at the third port 1008, which is the E-plane port. The $S_{In}^5$ 1054 is assumed to have a fifth signal input amplitude ("$A_5$") and a fifth signal phase ("$\varphi_5$") and $S_{In}^6$ 1056 is assumed to have a sixth signal amplitude ("$A_6$") and a sixth signal phase ("$\varphi_6$"). The second EHT-coupler 914 is configured to receive a seventh input signal ("$S_{In}^7$") 1060 at the fourth port 920, which is the H-plane port, and an eighth input signal ("$S_{In}^8$") 1062 at the third port 922, which is the E-plane port. The $S_{In}^7$ 1058 is assumed to have a seventh signal input amplitude ("$A_7$") and a seventh signal phase ("$\varphi_7$") and $S_{In}^8$ 1060 is assumed to have an eighth signal amplitude ("$A_8$") and an eighth signal phase ("$\varphi_8$").

In response to receiving these eight input signals $S_{In}^1$ 1048, $S_{In}^2$ 1050, $S_{In}^3$ 1052, $S_{In}^4$ 1054, $S_{In}^5$ 1056, $S_{In}^6$ 1058, $S_{In}^7$ 1060, and $S_{In}^8$ 1062, the PDRN 1000 produces eight output signals for each input signal. Specifically, $S_{In}^1$ 1048 will produce a first output signal $O_{In_1}^1$ and second output signal $O_{In_1}^2$ at the first 744 and second port 746, respectively, of the fifth EHT-coupler 702 and a third output signal $O_{In_1}^3$ at the first port 752 and a fourth output signal $O_{In_1}^4$ at the second port 754 of the sixth EHT-coupler 704. Additionally, $S_{In}^1$ 1048 will also produce a fifth $O_{In_1}^5$ and sixth $O_{In_1}^6$ output signal at the second port 806 and first port 804, respectively, of the seventh EHT-coupler 800. Moreover, the $S_{In}^1$ 1048 will also produce a seventh $O_{In_1}^7$ and eighth $O_{In_1}^8$ output signal at the second port 814 and first port 812, respectively, of the eighth EHT-coupler 802.

Utilizing this same approach it can be shown that the PDRN 1000 outputs corresponding to each of the other seven input signals $S_{In}^2$ 1050, $S_{In}^3$ 1052, $S_{In}^4$ 1054, $S_{In}^5$ 1056, $S_{In}^6$ 1058, $S_{In}^7$ 1060, and $S_{In}^8$ 1062 also produces eight output signals for each input signal. As such, the eight input signals produce a total of 64 output signals at the outputs of the fifth 702, sixth 704, seventh 800, and eighth 802 EHT-couplers. These total outputs may be organized into an 8 by 8 table (table 3 below) that shows the output signal at a given in port corresponding to an input signal and an input port.

TABLE 3

| In\Out | $5^{th}$ EHT-coupler Port 1 | $5^{th}$ EHT-coupler Port 2 | $6^{th}$ EHT-coupler Port 1 | $6^{th}$ EHT-coupler Port 2 | $7^{th}$ EHT-coupler Port 1 | $7^{th}$ EHT-coupler Port 2 | $8^{th}$ EHT-coupler Port 1 | $8^{th}$ EHT-coupler Port 2 |
|---|---|---|---|---|---|---|---|---|
| $S_{In}^1$ | $O_{In_1}^1$ | $O_{In_1}^2$ | $O_{In_1}^3$ | $O_{In_1}^4$ | $O_{In_1}^5$ | $O_{In_1}^6$ | $O_{In_1}^7$ | $O_{In_1}^8$ |
| $S_{In}^2$ | $O_{In_2}^1$ | $O_{In_2}^2$ | $O_{In_2}^3$ | $O_{In_2}^4$ | $O_{In_2}^5$ | $O_{In_2}^6$ | $O_{In_2}^7$ | $O_{In_2}^8$ |
| $S_{In}^3$ | $O_{In_3}^1$ | $O_{In_3}^2$ | $O_{In_3}^3$ | $O_{In_3}^4$ | $O_{In_3}^5$ | $O_{In_3}^6$ | $O_{In_3}^7$ | $O_{In_3}^8$ |
| $S_{In}^4$ | $O_{In_4}^1$ | $O_{In_4}^2$ | $O_{In_4}^3$ | $O_{In_4}^4$ | $O_{In_4}^5$ | $O_{In_4}^6$ | $O_{In_4}^7$ | $O_{In_4}^8$ |
| $S_{In}^5$ | $O_{In_5}^1$ | $O_{In_5}^2$ | $O_{In_5}^3$ | $O_{In_5}^4$ | $O_{In_5}^5$ | $O_{In_5}^6$ | $O_{In_5}^7$ | $O_{In_5}^8$ |
| $S_{In}^6$ | $O_{In_6}^1$ | $O_{In_6}^2$ | $O_{In_6}^3$ | $O_{In_6}^4$ | $O_{In_6}^5$ | $O_{In_6}^6$ | $O_{In_6}^7$ | $O_{In_6}^8$ |
| $S_{In}^7$ | $O_{In_7}^1$ | $O_{In_7}^2$ | $O_{In_7}^3$ | $O_{In_7}^4$ | $O_{In_7}^5$ | $O_{In_7}^6$ | $O_{In_7}^7$ | $O_{In_7}^8$ |
| $S_{In}^8$ | $O_{In_8}^1$ | $O_{In_8}^2$ | $O_{In_8}^3$ | $O_{In_8}^4$ | $O_{In_8}^5$ | $O_{In_8}^6$ | $O_{In_8}^7$ | $O_{In_8}^8$ |

In this example, utilizing the assumed amplitude and phase value for the input signals $S_{In}^1$ 1048, $S_{In}^2$ 1050, $S_{In}^3$ 1052, $S_{In}^4$ 1054, $S_{In}^5$ 1056, $S_{In}^6$ 1058, $S_{In}^7$ 1060, and $S_{In}^8$ 1062, the output signals may be described in relation to the input amplitudes and phase (as was done previously in the sections describing FIGS. 6A, 6B, and 6C). In this case the output signals shown in Table 3 may be replaced with the following amplitude and phase values.

| In\Out | $5^{th}$ EHT-coupler Port 1 | $5^{th}$ EHT-coupler Port 2 | $6^{th}$ EHT-coupler Port 1 | $6^{th}$ EHT-coupler Port 2 | $7^{th}$ EHT-coupler Port 1 | $7^{th}$ EHT-coupler Port 2 | $8^{th}$ EHT-coupler Port 1 | $8^{th}$ EHT-coupler Port 2 |
|---|---|---|---|---|---|---|---|---|
| $S_{In}^1$ | ⅛$A_1$, $\phi_1$ | ⅛$A_1$, $\phi_1$ | ⅛$A_1$, $\phi_1$ | ⅛$A_1$, $\phi_1$ | ⅛$A_1$, $\phi_1$ + 180 | ⅛$A_1$, $\phi_1$ | ⅛$A_1$, $\phi_1$ + 180 | ⅛$A_1$, $\phi_1$ |
| $S_{In}^2$ | ⅛$A_2$, $\phi_2$ + 180 | ⅛$A_2$, $\phi_2$ + 180 | ⅛$A_2$, $\phi_2$ | ⅛$A_2$, $\phi_2$ | ⅛$A_2$, $\phi_2$ | ⅛$A_2$, $\phi_2$ + 180 | ⅛$A_2$, $\phi_2$ + 180 | ⅛$A_2$, $\phi_2$ |
| $S_{In}^3$ | ⅛$A_3$, $\phi_3$ | ⅛$A_3$, $\phi_3$ | ⅛$A_3$, $\phi_3$ | ⅛$A_3$, $\phi_3$ | ⅛$A_3$, $\phi_3$ | ⅛$A_3$, $\phi_3$ + 180 | ⅛$A_3$, $\phi_3$ | ⅛$A_3$, $\phi_3$ + 180 |
| $S_{In}^4$ | ⅛$A_4$, $\phi_4$ + 180 | ⅛$A_4$, $\phi_4$ + 180 | ⅛$A_4$, $\phi_4$ | ⅛$A_4$, $\phi_4$ | ⅛$A_4$, $\phi_4$ + 180 | ⅛$A_4$, $\phi_4$ | ⅛$A_4$, $\phi_4$ | ⅛$A_4$, $\phi_4$ + 180 |
| $S_{In}^5$ | ⅛$A_5$, $\phi_5$ + 180 | ⅛$A_5$, $\phi_5$ | ⅛$A_5$, $\phi_5$ + 180 | ⅛$A_5$, $\phi_5$ | ⅛$A_5$, $\phi_5$ | ⅛$A_5$, $\phi_5$ | ⅛$A_5$, $\phi_5$ | ⅛$A_5$, $\phi_5$ |
| $S_{In}^6$ | ⅛$A_6$, $\phi_6$ + 180 | ⅛$A_6$, $\phi_6$ | ⅛$A_6$, $\phi_6$ | ⅛$A_6$, $\phi_6$ + 180 | ⅛$A_6$, $\phi_6$ | ⅛$A_6$, $\phi_6$ | ⅛$A_6$, $\phi_6$ + 180 | ⅛$A_6$, $\phi_6$ + 180 |
| $S_{In}^7$ | ⅛$A_7$, $\phi_7$ | ⅛$A_7$, $\phi_7$ + 180 | ⅛$A_7$, $\phi_7$ | ⅛$A_7$, $\phi_7$ + 180 | ⅛$A_7$, $\phi_7$ | ⅛$A_7$, $\phi_7$ | ⅛$A_7$, $\phi_7$ | ⅛$A_7$, $\phi_7$ |
| $S_{In}^8$ | ⅛$A_8$, $\phi_8$ | ⅛$A_8$, $\phi_8$ + 180 | ⅛$A_8$, $\phi_8$ + 180 | ⅛$A_8$, $\phi_8$ | ⅛$A_8$, $\phi_8$ | ⅛$A_8$, $\phi_8$ | ⅛$A_8$, $\phi_8$ + 180 | ⅛$A_8$, $\phi_8$ + 180 |

Assuming that the input phases (i.e., $\varphi_1, \varphi_2, \varphi_3, \varphi_4, \varphi_5, \varphi_6, \varphi_7$, and $\varphi_8$) are all normalized to zero and the input amplitudes (i.e., $A_1, A_2, A_3, A_4, A_5, A_6, A_7$, and $A_8$) are normalized to 1, the resulting example scattering matrix for the PDRN 1000 is then $$S = \frac{1}{\sqrt{8}} \begin{bmatrix} 0 & 0 & 0 & 0 & 0 & 0 & 0 & 0 & 1 & 1 & 1 & 1 & -1 & 1 & -1 & 1 \\ 0 & 0 & 0 & 0 & 0 & 0 & 0 & 0 & -1 & -1 & 1 & 1 & 1 & -1 & -1 & 1 \\ 0 & 0 & 0 & 0 & 0 & 0 & 0 & 0 & 1 & 1 & 1 & 1 & 1 & -1 & 1 & -1 \\ 0 & 0 & 0 & 0 & 0 & 0 & 0 & 0 & -1 & -1 & 1 & 1 & -1 & 1 & 1 & -1 \\ 0 & 0 & 0 & 0 & 0 & 0 & 0 & 0 & -1 & 1 & -1 & 1 & 1 & 1 & 1 & 1 \\ 0 & 0 & 0 & 0 & 0 & 0 & 0 & 0 & -1 & 1 & 1 & -1 & 1 & 1 & -1 & -1 \\ 0 & 0 & 0 & 0 & 0 & 0 & 0 & 0 & 1 & -1 & 1 & -1 & 1 & 1 & 1 & 1 \\ 0 & 0 & 0 & 0 & 0 & 0 & 0 & 0 & 1 & -1 & -1 & 1 & 1 & 1 & -1 & -1 \\ 1 & -1 & 1 & -1 & -1 & -1 & 1 & 1 & 0 & 0 & 0 & 0 & 0 & 0 & 0 & 0 \\ 1 & -1 & 1 & -1 & 1 & 1 & -1 & -1 & 0 & 0 & 0 & 0 & 0 & 0 & 0 & 0 \\ 1 & 1 & 1 & 1 & -1 & 1 & 1 & -1 & 0 & 0 & 0 & 0 & 0 & 0 & 0 & 0 \\ 1 & 1 & 1 & 1 & 1 & -1 & -1 & 1 & 0 & 0 & 0 & 0 & 0 & 0 & 0 & 0 \\ -1 & 1 & 1 & -1 & 1 & 1 & 1 & 1 & 0 & 0 & 0 & 0 & 0 & 0 & 0 & 0 \\ 1 & -1 & -1 & 1 & 1 & 1 & 1 & 1 & 0 & 0 & 0 & 0 & 0 & 0 & 0 & 0 \\ -1 & -1 & 1 & 1 & -1 & 1 & -1 & 0 & 0 & 0 & 0 & 0 & 0 & 0 & 0 & 0 \\ 1 & 1 & -1 & -1 & 1 & -1 & 1 & -1 & 0 & 0 & 0 & 0 & 0 & 0 & 0 & 0 \end{bmatrix}.$$

From these amplitude and phase values, it is seen that the PDRN 1000 is capable of dividing the power of any signal input into any of the eight input ports 720, 722, 728, 920, 922, 1002, 1008, and 1010 into eight (at output ports 744, 746, 752, 754, 804, 806, 812, and 814) approximately equal outputs that are approximately equal to ⅛ the power of the input signal.

An advantage of this is that the power of an input signal may be too high to properly process or amplify with sufficient fidelity. As such, the PDRN 1000 allow for that input signal to be divided down into a number of replica lower power signals that may be switched, processed, and/or amplified before recombining the modified signals into a new combined signal that will effectively be a high fidelity switched, processed, and/or amplified signal of the original input high power signal. Examples of amplifiers may include solid-state amplifiers and/or traveling wave tube amplifiers ("TWTAs").

Based on the above description, the 8×8 MWN 900 is means for dividing an input power signal such as, for example, any of the eight input signals $S_{In}^1$ through $S_{In}^8$, having an input amplitudes (i.e., $A_1, A_2, A_3, A_4, A_5, A_6, A_7$, and $A_8$) into eight intermediate power signals, wherein each of the intermediate power signals has an intermediate amplitude value equal to approximately one-eighth the corresponding amplitude value (i.e., $A_1, A_2, A_3, A_4, A_5, A_6, A_7$, and $A_8$).

Figure 11:
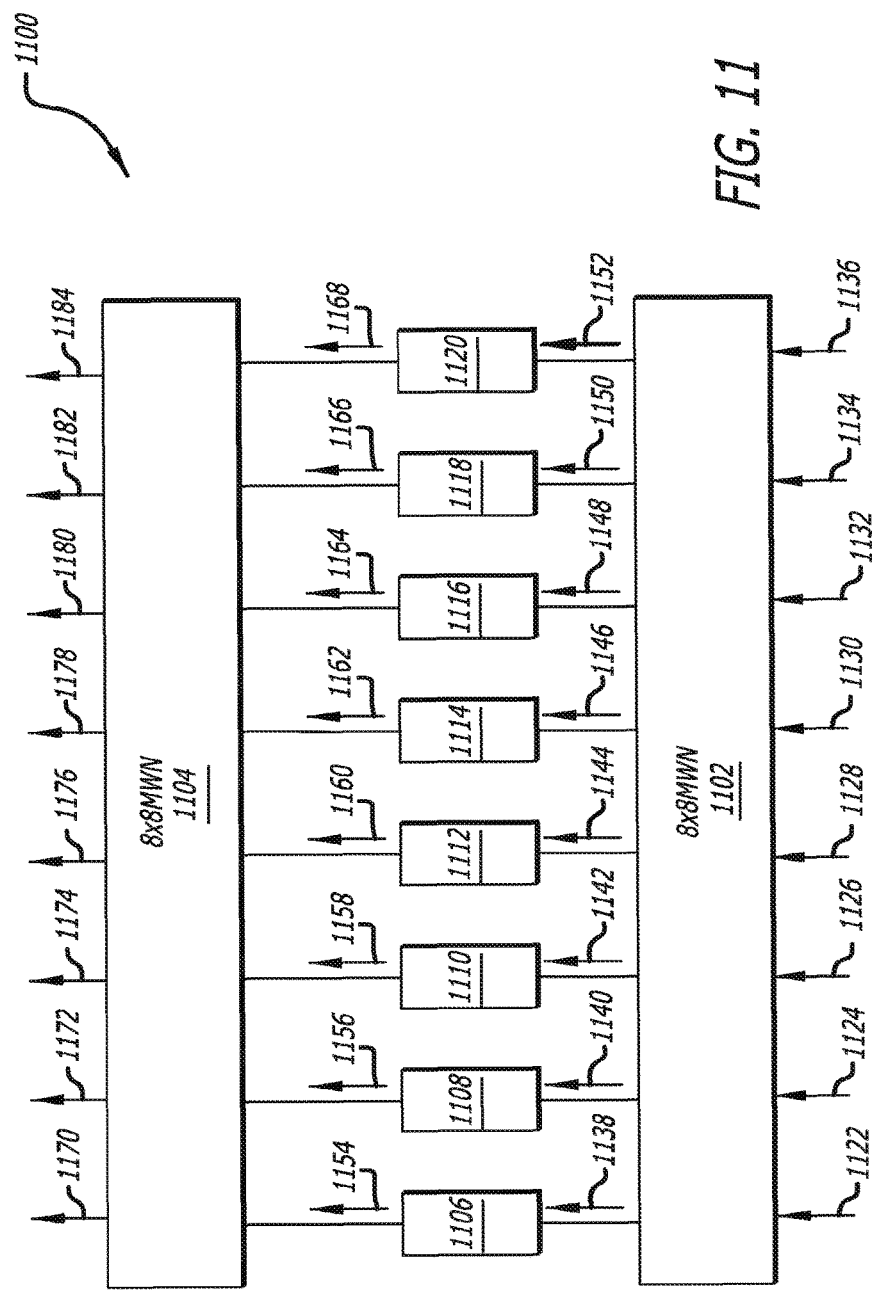
FIG. 11 is a block diagram of an example of an implementation of a PDRN in accordance with the present invention.

FIG. 11 is a block diagram of an example of an implementation of a PDRN 1100 in accordance with the present invention. The PDRN 1100 may include a first 8×8 MWN 1102 and a second 8×8 MWN 1104 in signal communication with each other. In between the first 1102 and second 1104 8×8 MWNs may be eight devices 1106, 1108, 1110, 1112, 1114, 1116, 1118, and 1120 or signal paths (such as, for example, waveguide runs). The eight devices 1106, 1108, 1110, 1112, 1114, 1116, 1118, and 1120 may be a plurality of solid-state or TWTAs amplifiers, switches, phase-shifters, straight pass-through waveguides, or other processing devices. In this example, the first 8×8 MWN 1102 is configured to receive eight input signals $S_{In}^1$ 1122, $S_{In}^2$ 1124, $S_{In}^3$ 1126, $S_{In}^4$ 1128, $S_{In}^5$ 1130, $S_{In}^6$ 1132, $S_{In}^7$ 1134, and $S_{In}^8$ 1136 and produce eight output signals $S_{Out}^1$ 1138, $S_{Out}^2$ 1140, $S_{Out}^3$ 1142, $S_{Out}^4$ 1144, $S_{Out}^5$ 1146, $S_{Out}^6$ 1148, $S_{Out}^7$ 1150, and $S_{Out}^8$ 1152. As described earlier, the $S_{Out}^1$ 1138, $S_{Out}^2$ 1140, $S_{Out}^3$ 1142, $S_{Out}^4$ 1144, $S_{Out}^5$ 1146, $S_{Out}^6$ 1148, $S_{Out}^7$ 1150, and $S_{Out}^8$ 1152 may each vary based on the respective input signal (either $S_{In}^1$ 1122, $S_{In}^2$ 1124, $S_{In}^3$ 1126, $S_{In}^4$ 1128, $S_{In}^5$ 1130, $S_{In}^6$ 1132, $S_{In}^7$ 1134, and $S_{In}^8$ 1136) that is input into the first 8×8 MWN 1102. These varying combinations have already been described in relation to the 8×8 MWN 900 of FIGS. 9A and 9B and the PDRN 1000 of FIG. 10. Once these $S_{Out}^1$ 1138, $S_{Out}^2$ 1140, $S_{Out}^3$ 1142, $S_{Out}^4$ 1144, $S_{Out}^5$ 1146, $S_{Out}^6$ 1148, $S_{Out}^7$ 1150, and $S_{Out}^8$ 1152 are then passed through the eight devices 1106, 1108, 1110, 1112, 1114, 1116, 1118, and 1120 to produce eight intermediate signals $S_{INT}^1$ 1154, $S_{INT}^2$ 1156, $S_{INT}^3$ 1158, $S_{INT}^4$ 1160, $S_{INT}^5$ 1162, $S_{INT}^6$ 1164, $S_{INT}^7$ 1166, and $S_{INT}^8$ 1168 that are passed to the second 8×8 MWN 1104. The second 8×8 MWN 1104 is then configured to receive the $S_{INT}^1$ 1154, $S_{INT}^2$ 1156, $S_{INT}^3$ 1158, $S_{INT}^4$ 1160, $S_{INT}^5$ 1162, $S_{INT}^6$ 1164, $S_{INT}^7$ 1166, and $S_{INT}^8$ 1168 and produce eight output signals $S_{OUT}^1$ 1170, $S_{OUT}^2$ 1172, $S_{OUT}^3$ 1174, $S_{OUT}^4$ 1176, $S_{OUT}^5$ 1178, $S_{OUT}^6$ 1180, $S_{OUT}^7$ 1182, and $S_{OUT}^8$ 1184.

Figure 12:
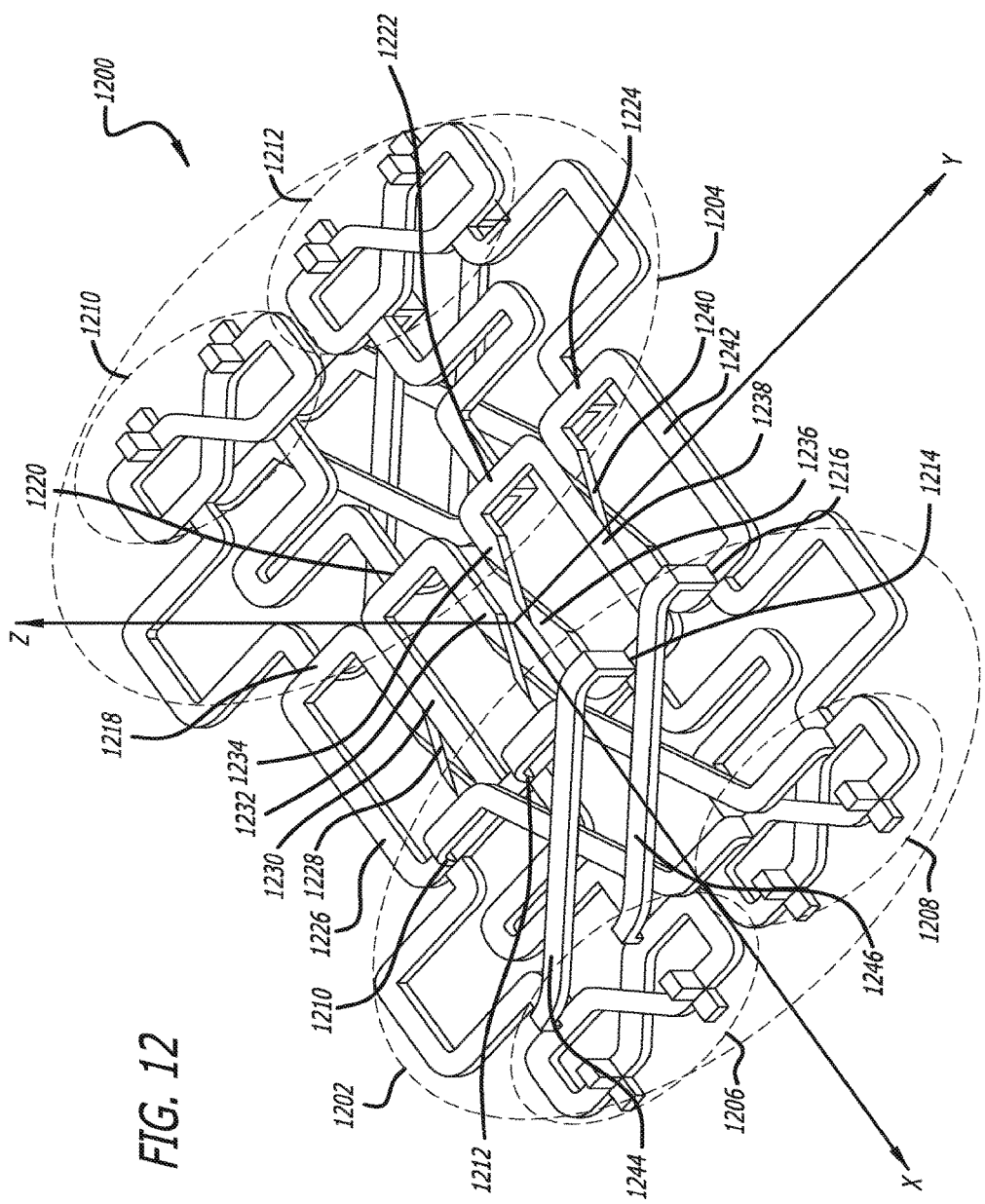
FIG. 12 is top perspective view of an example of an implementation of a PDRN utilizing a first 8×8 MWN and a second 8×8 MWN is shown in accordance with the present invention.

In FIG. 12, a top perspective view of an example of an implementation of a PDRN 1200 utilizing a first 8×8 MWN 1202 and second 8×8 MWN 1204 is shown in accordance with the invention. The first 8×8 MWN 1202 may include a first 4×4 MWN 1206 and second 4×4 MWN 1208 which are in signal communication with a four EHT-couplers 1210, 1212, 1214, and 1216, respectively. Similarly, the second 8×8 MWN 1204 may include a first 4×4 MWN 1210 and second 4×4 MWN 1212 which are in signal communication with another four EHT-couplers 1218, 1220, 1222, and 1224, respectively. The first, second, third, and fourth EHT-couplers 1210, 1212, 1214, and 1216 of the first 4×4 MWN 1210 are in signal communication with the first, second, third, and fourth EHT-couplers 1218, 1220, 1222, and 1224 of the second 4×4 MWN 1212 via signal paths (or devices) 1226, 1228, 1230, 1232, 1234, 1236, 1238, 1240, and 1242, respectively.

In this example, the first 4×4 MWN 1206 and second 4×4 MWN 1208 are configured to have all of the E-plane ports of the EHT-couplers pointing upward instead of having the E-plane ports of EHT-couplers pointing downward as in the first 4×4 MWN 700 (shown in FIGS. 7A, 7B, 8A, 8B, 9A and 9B). Additionally, the first, second, third, and fourth EHT-couplers 1210, 1212, 1214, and 1216 also all have their E-plane port pointing upward instead of having two E-plane ports (EHT-couplers 800 and 802 of FIGS. 8A, 8B, 9A, and 9B) pointing downward. Moreover, the waveguide signal paths 1244 and 1246 (along which the E-plane ports of the third 1214 and fourth 1216 EHT-couplers are in signal communication with the first 4×4 MWN 1206) are above the plane in which the signal paths between the first 4×4 MWN 1206 and second 4×4 MWN 1208 are in signal communication with the H-plane ports of the first, second, third, and fourth EHT-couplers 1210, 1212, 1214, and 1216, unlike the signal paths 804 and 806 (shown in FIGS. 8A, 8B, 9A, and 9B) of the 8×8 MWN 900 (shown in FIGS. 9A and 9B) that are below the plane of the first 706, second 708, third 908, and fourth 910 signal paths shown in FIGS. 9A and 9B.

In this example, the second 8×8 MWN 1204 is configured in the same way as the first 8×8 MWN 1202 except that it is rotated 180 degrees in the vertical direction such that all the E-plane ports of all the EHT-couplers are pointing in a downward direction. Additionally, the first 1226, third 1230, sixth 1238, and eighth 1242 signal paths are shown to be straight pass through waveguides, while the second 1228, fourth 1232, fifth 1236, and seventh 1240 signal paths are shown to be 180 degree phase shifters. It is appreciated that the signal paths 1226, 1228, 1230, 1232, 1234, 1236, 1238, 1240, and 1242 may also optionally include other devices not shown such as, for example, amplifiers (such as, for example, TWTA or solid-state amplifiers), switches, or other transmission processing devices.

As an example of operation, the PDRN 1200 is configured to receive eight input signals (not shown) and produce a corresponding eight output signals. Similar to the description already described earlier, the PDRN 1200 is configured to receive one input signal (at one input port of the first 8×8 MWN 1202) that is divided into eight intermediate signals (not shown) that are emitted from all eight output ports of the first 8×8 MWN 1202. The amplitudes of the eight intermediate signals are each equal to approximately ⅛ the power amplitude of the input signal and the phases (which are approximately 0 or 180 degrees) of each of the eight intermediate signals varies based on which input port (of the first 8×8 MWN 1202) is injected with the input signal. Once the eight intermediate signal are injected into the eight signal paths 1226, 1228, 1230, 1232, 1234, 1236, 1238, 1240, and 1242, the first 1226, third 1230, sixth 1238, and 1242 eighth signal paths pass their corresponding intermediate signals directly to the input ports of the second 8×8 MWN 1204, while the second 1228, fourth 1232, fifth 1234, and seventh 1240 signal paths phase shift their corresponding intermediate signals by 180 degrees and pass then to their corresponding input ports of the second 8×8 MWN 1204. It is noted that in this example, the input ports of the second 8×8 MWN 1204 are the same physically as the output ports of the first 8×8 MWN 1202; likewise, the output ports of the second 8×8 MWN 1204 are the same physically as the input ports of the first 8×8 MWN 1202. Once the intermediate signals that have been either passed or phase shifted by the eight signal paths 1226, 1228, 1230, 1232, 1234, 1236, 1238, 1240 are injected into the input ports of the second 8×8 MWN 1204, these intermediate signals are combined within the second 8×8 MWN 1204 such that a signal output signal is emitted from one of the eight output ports of the second 8×8 MWN 1204. The output port of which the output signal is emitted and the phase (which are approximately 0 or 180 degrees) of output signal varies based on which input port (of the first 8×8 MWN 1202) is injected with the input signal. Based on this description and assuming that the input phases (i.e., $\varphi_1$, $\varphi_2$, $\varphi_3$, $\varphi_4$, $\varphi_5$, $\varphi_6$, $\varphi_7$, and $\varphi_8$) of the input signals (injected into the first 8×8 MWN 1202) are all normalized to zero and the input amplitudes (i.e., $A_1$, $A_2$, $A_3$, $A_4$, $A_5$, $A_6$, $A_7$, and $A_8$) are normalized to 1, the resulting example scattering matrix for the PDRN 1200 is $$S = \begin{bmatrix} 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 1 \\ 0 & 0 & 0 & 0 & 0 & 0 & 0 & 0 & 0 & 0 & 0 & -1 & 0 & 0 & 0 \\ 0 & 0 & 0 & 0 & 0 & 0 & 0 & 0 & 0 & 0 & 0 & 0 & -1 & 0 & 0 \\ 0 & 0 & 0 & 0 & 0 & 0 & 0 & 0 & 0 & -1 & 0 & 0 & 0 & 0 & 0 \\ 0 & 0 & 0 & 0 & 0 & 0 & 0 & 0 & 0 & 0 & -1 & 0 & 0 & 0 & 0 \\ 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 \\ 0 & 0 & 0 & 0 & -1 & 0 & 0 & 0 & 0 & 0 & 0 & 0 & 0 & 0 & 0 \\ 0 & 0 & 0 & 0 & 0 & -1 & 0 & 0 & 0 & 0 & 0 & 0 & 0 & 0 & 0 \\ 0 & 0 & -1 & 0 & 0 & 0 & 0 & 0 & 0 & 0 & 0 & 0 & 0 & 0 & 0 \\ 0 & 0 & 0 & -1 & 0 & 0 & 0 & 0 & 0 & 0 & 0 & 0 & 0 & 0 & 0 \\ 1 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 \end{bmatrix}.$$

Based on this description for the PDRN 1200, the PDRN 1200 includes: a means for dividing an input power signal having a first amplitude value into eight intermediate power signals, wherein each intermediate power signal has an intermediate amplitude value equal to approximately one-eighth the first amplitude value; means for processing the intermediate power signals; and means for combining the intermediate power signal into a single output power signal. In this example, the a means for dividing an input power signal having a first amplitude value into eight intermediate power signals may be the first 8×8 MWN 1202. The means for processing the intermediate power signals may include the plurality of devices in signal communication between the first 8×8 MWN 1202 and second 8×8 MWN 1204 which may be pass through waveguides and/or phase shifters, as shown by the eight signal paths 1226, 1228, 1230, 1232, 1234, 1236, 1238, 1240, or active devices such as a plurality of amplifiers (both solid-state or TWTA). The means for means for combining the intermediate power signal into a single output power signal may be the second 8×8 MWN 1204.

It will be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

What is claimed is:

1. An enhanced hybrid-tee coupler ("EHT-coupler"), the EHT-coupler comprising:
 a first waveguide defining a first port;
 a second waveguide defining a second port;
 a third waveguide defining a third port;
 a fourth waveguide defining a fourth port, wherein the first, second, third, and fourth waveguides meet in a common junction, the first waveguide and second waveguide are collinear, the third waveguide forms an E-plane junction with both the first waveguide and the second waveguide, and the fourth waveguide forms an H-plane junction with both the first waveguide and the second waveguide;

a first impedance matching element positioned in the common junction, wherein the first impedance matching element includes a base and a tip, wherein the base is located at a coplanar common waveguide wall of the first waveguide, second waveguide, and fourth waveguide, and the tip extends outward from the base and is directed towards the third waveguide, and wherein the base is a gradual three-dimensional transitional shaped object that gradually transitions a physical geometry of the first impedance matching element from coplanar common waveguide wall to the tip and the tip is a cone or a pyramid;

a second impedance matching element positioned at a first top wall of the first waveguide external to the common junction;

a third impedance matching element positioned at a second top wall of the second waveguide external to the common junction; and a fourth impedance matching element positioned at a third top wall of the fourth waveguide external to the common junction, wherein the first top wall and the second top wall are opposing waveguide walls that are opposite to the coplanar common waveguide wall, and the third top wall is an opposing waveguide wall that is opposite to the coplanar common waveguide wall;

a fifth impedance matching element positioned at a front broad wall of the third waveguide external to the common junction; and a sixth impedance matching element positioned at a back broad wall of the third waveguide external to the common junction, wherein the front broad wall is opposite the back broad wall.

2. The EHT-coupler of claim 1, further including a seventh impedance matching element positioned at a first side-wall of the fourth waveguide external to the common junction, and an eighth impedance matching element positioned at a second side-wall of the fourth waveguide external to the common junction, wherein the second side-wall is opposite the first side-wall.

3. The EHT-coupler of claim 2, wherein the seventh and eighth impedance matching elements form a waveguide transformer that narrows a first waveguide width of the fourth waveguide, at the fourth port, to a second narrower waveguide dimension prior to the common junction.

4. The EHT-coupler of claim 3, wherein the first impedance matching element is of a material selected from the group consisting of copper, silver, aluminum, gold, and any metal that has a low bulk resistivity.

5. The EHT-coupler of claim 3, wherein the first, second, third, and fourth waveguides are rectangular waveguides.

6. The EHT-coupler of claim 5, wherein the rectangular waveguides have internal dimensions of 0.750 inches by 0.375 inches.

7. The EHT-coupler of claim 6, wherein the first, second, third, fourth, fifth, and sixth impedance matching elements are capacitive tuning elements.

8. The EHT-coupler of claim 7,
wherein the first and second waveguides have a common narrow wall,
wherein the third waveguide includes a back narrow wall that is coplanar with the common narrow wall of the first and second waveguides,
wherein the first matching element is approximately 0.655 inches in height extending from the coplanar common waveguide wall,
wherein the first impedance matching element is approximately 1.14 inches in diameter at the base,
wherein the diameter extends radially from a centerline of the back narrow wall of the third waveguide,
wherein the base of the first impedance matching element extends approximately 0.8125 inches from the back narrow wall.

9. The EHT-coupler of claim 8,
wherein the coplanar common waveguide wall has a centerline, and
wherein the tip of the first impedance matching element is offset from the centerline of the coplanar common waveguide wall.

10. The EHT-coupler of claim 9, wherein the tip is approximately 0.250 inches from the back narrow wall of the third waveguide.

11. The EHT-coupler of claim 10,
wherein the second and third impedance matching elements are aligned along the centerline of the first and second waveguides, and
wherein the fourth impedance matching element is aligned along the centerline of the fourth waveguide.

12. The EHT-coupler of claim 11, wherein the seventh and eight impedance matching elements are aligned along a centerline of the third waveguide.

13. The EHT-coupler of claim 12, wherein the seventh and eight impedance matching elements are configured as an inductive iris.

14. The EHT-coupler of claim 12,
wherein the second impedance element is a capacitive tuning stub that has an approximate 0.112 inch diameter that is located approximately 0.296 inches away from the back broad wall and extends approximately 0.050 inches from the first top wall,
wherein the third impedance element is a capacitive tuning stub that has an approximate 0.112 inch diameter that is located approximately 0.296 inches away from the front broad wall and extends approximately 0.050 inches from the second top wall, and
wherein the fourth impedance element is a capacitive tuning stub that has an approximate 0.112 inch diameter that is located approximately 0.296 inches away from the front narrow wall and extends approximately 0.070 inches from the second top wall.

15. The EHT-coupler of claim 14,
wherein the fifth impedance element is a capacitive tuning stub that has an approximate 0.112 inch diameter that is located approximately 0.396 inches away from the first top wall and extends approximately 0.045 inches from the first broad wall of the third waveguide, and
wherein the sixth impedance element is a capacitive tuning stub that has an approximate 0.112 inch diameter that is located approximately 0.396 inches away from the second top wall and extends approximately 0.045 inches from the second broad wall of the third waveguide.

16. The EHT-coupler of claim 15,
wherein the seventh and eighth impedance matching elements form a waveguide transformer that narrows a first waveguide width of the fourth waveguide, at the fourth port, to a second narrower waveguide dimension prior to the common junction, wherein the seventh and eighth impedance matching elements are located approximately 0.296 inches from the front narrow wall of third waveguide, wherein the first waveguide width is approximately 0.750 inches, and wherein the second waveguide width is approximately 0.710 inches.

17. An enhanced hybrid-tee coupler ("EHT-coupler"), the EHT-coupler comprising:

a first waveguide defining a first port;
a second waveguide defining a second port;
a third waveguide defining a third port;
a fourth waveguide defining a fourth port,
wherein the first, second, third, and fourth waveguides meet in a common junction, the first waveguide and second waveguide are collinear, the third waveguide forms an E-plane junction with both the first waveguide and the second waveguide, and the fourth waveguide forms an H-plane junction with both the first waveguide and the second waveguide;
a first impedance matching element positioned in the common junction,
  wherein the first impedance matching element includes a base and a tip,
  wherein the base is located at a coplanar common waveguide wall of the first waveguide, second waveguide, and fourth waveguide, and the tip extends outward from the base and is directed towards the third waveguide, and
  wherein the base is a gradual three-dimensional transitional shaped object that gradually transitions a physical geometry of the first impedance matching element from coplanar common waveguide wall to the tip and the tip is a cone or a pyramid;
a first capacitive tuning stub positioned at a first top wall of the first waveguide external to the common junction;
a second capacitive tuning stub positioned at a second top wall of the second waveguide external to the common junction;
a third capacitive tuning stub positioned at a third top wall of the fourth waveguide external to the common junction, wherein the first top wall and the second top wall are opposing waveguide walls that are opposite to the coplanar common waveguide wall, and the third top wall is an opposing waveguide wall that is opposite to the coplanar common waveguide wall;
a fourth capacitive tuning stub positioned at a front broad wall of the third waveguide external to the common junction;
a fifth capacitive tuning stub positioned at a back broad wall of the third waveguide external to the common junction, wherein the front broad wall is opposite the back broad wall; and
a waveguide transformer that narrows a first waveguide width of the fourth waveguide, at the fourth port, to a second narrower waveguide dimension prior to the common junction.

18. The EHT-coupler of claim 17, wherein the first impedance matching element is of a material selected from the group consisting of copper, silver, aluminum, gold, and any metal that has a low bulk resistivity.

* * * * *